US011121017B2

(12) United States Patent
Hall et al.

(10) Patent No.: US 11,121,017 B2
(45) Date of Patent: Sep. 14, 2021

(54) LOAD PORT MODULE

(71) Applicant: Brooks Automation, Inc., Chelmsford, MA (US)

(72) Inventors: Daniel A. Hall, West Newbury, MA (US); Glenn L. Sindledecker, Dracut, MA (US); Matthew W. Coady, Hollis, NH (US); Marcello Trolio, Billerica, MA (US); Michael Spinazola, Wilmington, MA (US)

(73) Assignee: BROOKS AUTOMATION, INC., Chelmsford, MA (US)

( * ) Notice: Subject to any disclaimer, the term of this patent is extended or adjusted under 35 U.S.C. 154(b) by 1069 days.

(21) Appl. No.: 14/472,678

(22) Filed: Aug. 29, 2014

(65) Prior Publication Data

US 2014/0369793 A1 Dec. 18, 2014

Related U.S. Application Data

(62) Division of application No. 11/178,836, filed on Jul. 11, 2005, now Pat. No. 8,821,099.

(51) Int. Cl.
*H01L 21/677* (2006.01)
*H01L 21/67* (2006.01)
*H01L 21/673* (2006.01)
*B65G 47/34* (2006.01)

(52) U.S. Cl.
CPC ........ *H01L 21/67775* (2013.01); *B65G 47/34* (2013.01); *H01L 21/67265* (2013.01); *H01L 21/67379* (2013.01); *H01L 21/67772* (2013.01); *H01L 2924/0002* (2013.01)

(58) Field of Classification Search
None
See application file for complete search history.

(56) References Cited

U.S. PATENT DOCUMENTS

| 5,544,421 | A | | 8/1996 | Thompson et al. |
| 5,588,789 | A | * | 12/1996 | Muka ................ H01L 21/67766 414/217.1 |
| 5,970,621 | A | * | 10/1999 | Bazydola .......... H01L 21/67259 33/533 |
| 6,138,721 | A | | 10/2000 | Bonora et al. |
| 6,188,323 | B1 | | 2/2001 | Rosenquist et al. |
| 6,279,724 | B1 | | 8/2001 | Davis |
| 6,281,516 | B1 | | 8/2001 | Bacchi et al. |
| 6,501,070 | B1 | | 12/2002 | Bacchi et al. |

(Continued)

FOREIGN PATENT DOCUMENTS

| JP | 08250575 | 9/1996 |
| JP | 2001015580 | 1/2001 |

(Continued)

*Primary Examiner* — Karla A Moore
(74) *Attorney, Agent, or Firm* — Perman & Green, LLP; Colin C. Durham

(57) ABSTRACT

A substrate loading device having a frame, a cassette support, and a user interface. The frame is connected to a substrate processing apparatus. The frame has a transport opening through which substrates are transported between the device and processing apparatus. The cassette support is connected to the frame for holding at least one substrate holding cassette. The user interface is arranged for inputting information, and is mounted to the frame so that the user interface is integral with the frame.

24 Claims, 15 Drawing Sheets

(56) References Cited

U.S. PATENT DOCUMENTS

| | | |
|---|---|---|
| 6,591,162 B1 | 7/2003 | Martin |
| 6,672,820 B1 | 1/2004 | Hanson et al. |
| 6,784,418 B2 | 8/2004 | Bacchi et al. |
| 2001/0055522 A1 | 12/2001 | Kaneda et al. |
| 2002/0179863 A1 | 12/2002 | Harris et al. |
| 2003/0001083 A1* | 1/2003 | Corrado ............... G01D 11/245 250/239 |
| 2003/0012625 A1* | 1/2003 | Rosenquist ....... H01L 21/67775 414/217.1 |
| 2003/0044261 A1 | 3/2003 | Bonora et al. |
| 2003/0044268 A1 | 3/2003 | Bonora et al. |
| 2003/0091409 A1 | 5/2003 | Danna et al. |
| 2003/0159277 A1 | 8/2003 | Harris et al. |
| 2003/0173510 A1* | 9/2003 | Bacchi .............. H01L 21/67373 250/239 |
| 2004/0127029 A1 | 7/2004 | Okabe et al. |
| 2004/0262290 A1 | 12/2004 | Haanstra et al. |
| 2005/0096784 A1 | 5/2005 | Lai |

FOREIGN PATENT DOCUMENTS

| | | |
|---|---|---|
| JP | 2001250853 | 9/2001 |
| JP | 2003282389 | 10/2003 |
| JP | 2003297711 | 10/2003 |
| JP | 2004140377 | 5/2004 |
| JP | 2004228443 | 8/2004 |
| JP | 2004537850 | 12/2004 |
| JP | 2005520321 | 7/2005 |
| WO | 9932381 | 7/1999 |
| WO | 0060414 | 10/2000 |
| WO | 0246864 | 6/2002 |
| WO | 03007347 | 1/2003 |
| WO | 03009347 | 1/2003 |
| WO | 03019630 | 3/2003 |
| WO | 03021643 | 3/2003 |
| WO | 03021645 | 3/2003 |

\* cited by examiner

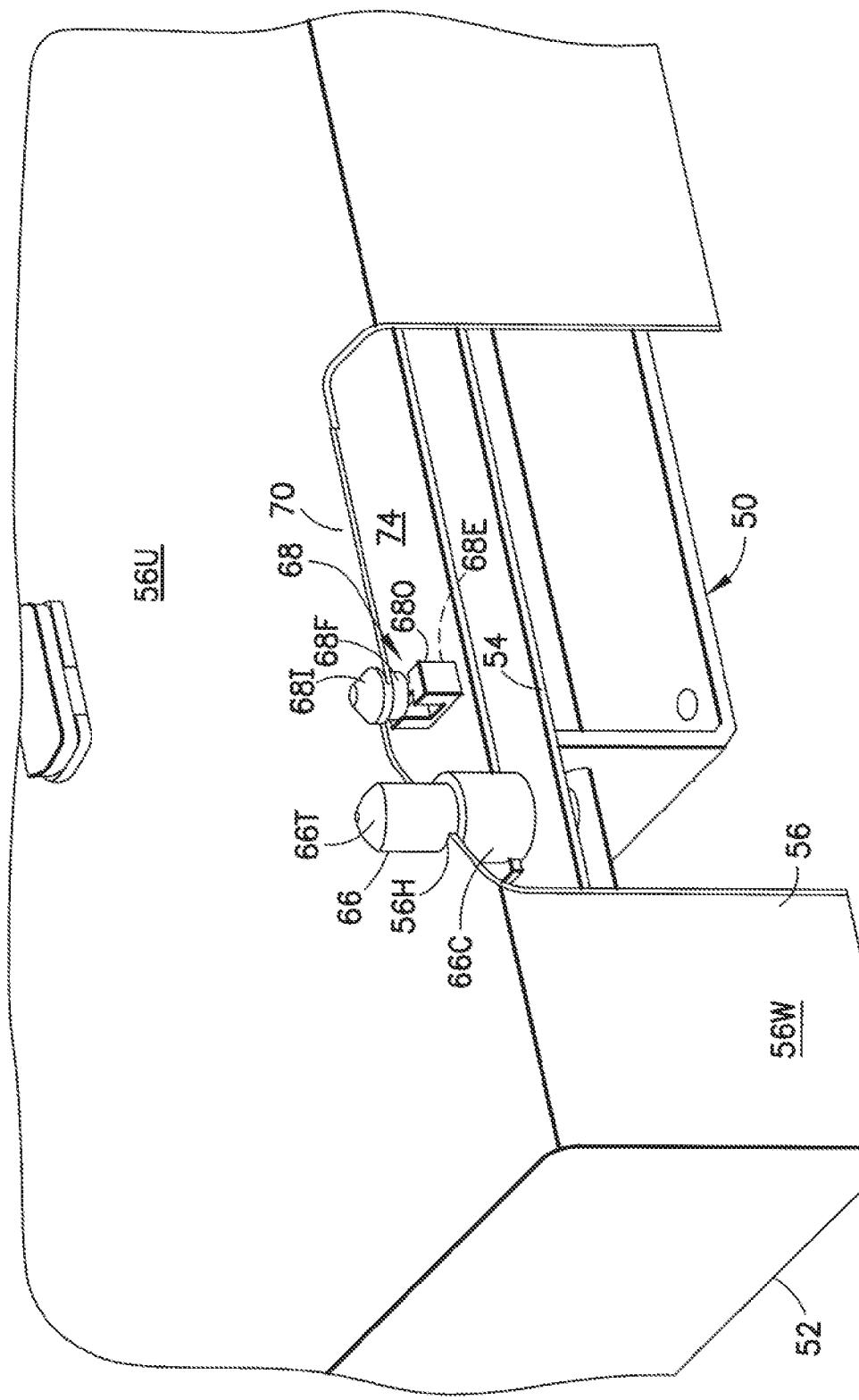

LOAD PORT MODULE

CROSS-REFERENCE TO RELATED APPLICATIONS

This application is a divisional of and claims the benefit of non-provisional patent application Ser. No. 11/178,836 filed on Jul. 11, 2005 the disclosure of which is incorporated herein by reference in its entirety.

BACKGROUND

1. Field of the Invention

The present invention relates to substrate processing apparatus and, more particularly, to an improved load port module for the substrate processing apparatus.

2. Brief Description of Related Developments

Continuous demand by consumers for ever cheaper electronic devices has maintained pressure on manufacturers of the device to improve efficiency. Indeed, in the current market place, many of the devices, and to a much greater extent the electronic and semiconductor components used in the devices, have become commodities. The desire of manufacturers of electronic and semiconductor device to increase efficiency manifests itself at all levels, but is of special significance in the design, construction, and operation of fabrication facilities or fabs, and the substrate processing apparatus used within the fabs.

SUMMARY OF THE EXEMPLARY EMBODIMENTS

In accordance with one exemplary embodiment of the present invention, a substrate loading device is provided. The substrate loading device comprises a frame, a cassette support, and a user interface. The frame is adapted for connecting the device to a substrate processing apparatus. The frame has a transport opening through which substrates are transported between the device and processing apparatus. The cassette support is connected to the frame for holding at least one substrate holding cassette. The user interface is arranged for inputting information. The user interface is mounted to the frame so that the user interface is integral with the frame.

In accordance with another exemplary embodiment of the present invention, a substrate loading device is provided. The substrate loading device comprises a frame, a cassette support and a display. The frame is adapted for connecting the device to a substrate processing apparatus. The frame has a transport opening through which substrates are transported between the device and processing apparatus. The cassette is connected to the frame for holding at least one substrate holding cassette. The display is arranged for displaying information related to a predetermined characteristic of the device. The display is capable of operating as a graphic user interface. The display is capable of being integrated with the frame to form an assembly capable of being made and then removed as a unit from the processing apparatus.

In accordance with another exemplary embodiment of the present invention, a substrate loading device is provided. The substrate loading device comprises a frame, and a substrate transport container support. The frame is adapted for connecting the device to a substrate processing apparatus. The frame has a transport opening through which substrates are transported between the device and processing apparatus. The substrate transport container support is connected to the frame for holding at least one substrate transport container. The transport container support comprises a cover, at least one detector, and a member. The cover covers at least a portion of the support on which the at least one substrate transport container is seated. The cover has a resiliently flexible section. The at least one detector is connected to the cover for detecting a presence of the least one transport container on the support. The member is connected to the flexible section of the cover to move as a unit with the flexible section. The member cooperates with the detector causing the detector to detect the presence of the transport container on the support.

In accordance with yet another exemplary embodiment of the present invention, a substrate loading device is provided. The substrate loading device comprises a frame and a substrate transport container support. The frame is adapted for connecting the device to a substrate processing apparatus. The frame has a transport opening through which substrates are transported between the device and processing apparatus. The substrate transport container support is connected to the frame for holding at least one substrate transport container. The support comprises a cover, and at least one detector. The cover covers at least a portion of the support on which the at least one substrate transport container is seated. The at least one detector is connected to the cover for detecting when the at least one transport container is on the support. The cover is of unitary construction and has a resiliently flexible tab. The detector comprises a member mounted to the tab for effecting detection, with the detector, of the at least one transport container on the support.

In accordance with still another exemplary embodiment of the present invention, a substrate loading device is provided. The device comprises a frame and a transport container shuttle. The frame is adapted for connecting the device to a substrate processing apparatus. The frame has a transport opening through which substrates are transported between the device and processing apparatus. The transport container shuttle is adapted for holding a substrate transport container and is movably connected to the frame. The shuttle is movable relative to the frame between a first terminal position and second terminal position. The second terminal position is variable for maintaining a predetermined gap between a surface of the transport container on the shuttle and frame surface when different transport containers are transported by the shuttle to the second terminal position.

In accordance with still yet another exemplary embodiment of the present invention, a substrate loading device is provided. The device comprises a frame, a transport container shuttle, and a sensor. The frame is adapted for connecting the device to a substrate processing apparatus. The frame has a transport opening through which substrates are transported between the device and processing apparatus. The transport container shuttle is adapted for holding a substrate transport container, and is movably connected to the frame. The shuttle is movable relative to the frame between a first terminal position and a second terminal position. The sensor is connected to the frame for remotely sensing a feature of the transport container when moved by the shuttle and determining the position of the feature relative to the frame.

In accordance with still yet another exemplary embodiment of the present invention, a substrate loading device is provided. The substrate loading device comprises a frame, a movable frame member, a drive and a sensor. The frame defines an opening through which substrates are transported along a substrate transport path between a substrate transport container on an exterior side of the frame and an interior side of the frame. The movable frame member is movably connected to the frame for blocking and unblocking the substrate transport path. The drive is connected to the frame for moving the movable frame member in a first direction to unblock the substrate transport path. The drive has a carry member carrying the frame member in the first direction. The sensor is capable of sensing a presence of a substrate. The sensor is movably connected to the carry member independent of the frame member. The carry member carries the sensor in the first direction when moving the frame member in the first direction. The sensor is movable relative to the frame in a second direction different from the first direction. The sensor is movable in the second direction to a position where the sensor is capable of sensing the presence of a substrate in the transport container.

BRIEF DESCRIPTION OF THE DRAWINGS

The foregoing aspects and other features of the present invention are explained in the following description, taken in connection with the accompanying drawings, wherein:

FIG. 8 is partial perspective view of the transport container support in FIG. 7A showing an integrated container detection switch of the support;

DETAILED DESCRIPTION OF THE EXEMPLARY EMBODIMENT(S)

Figure 1:
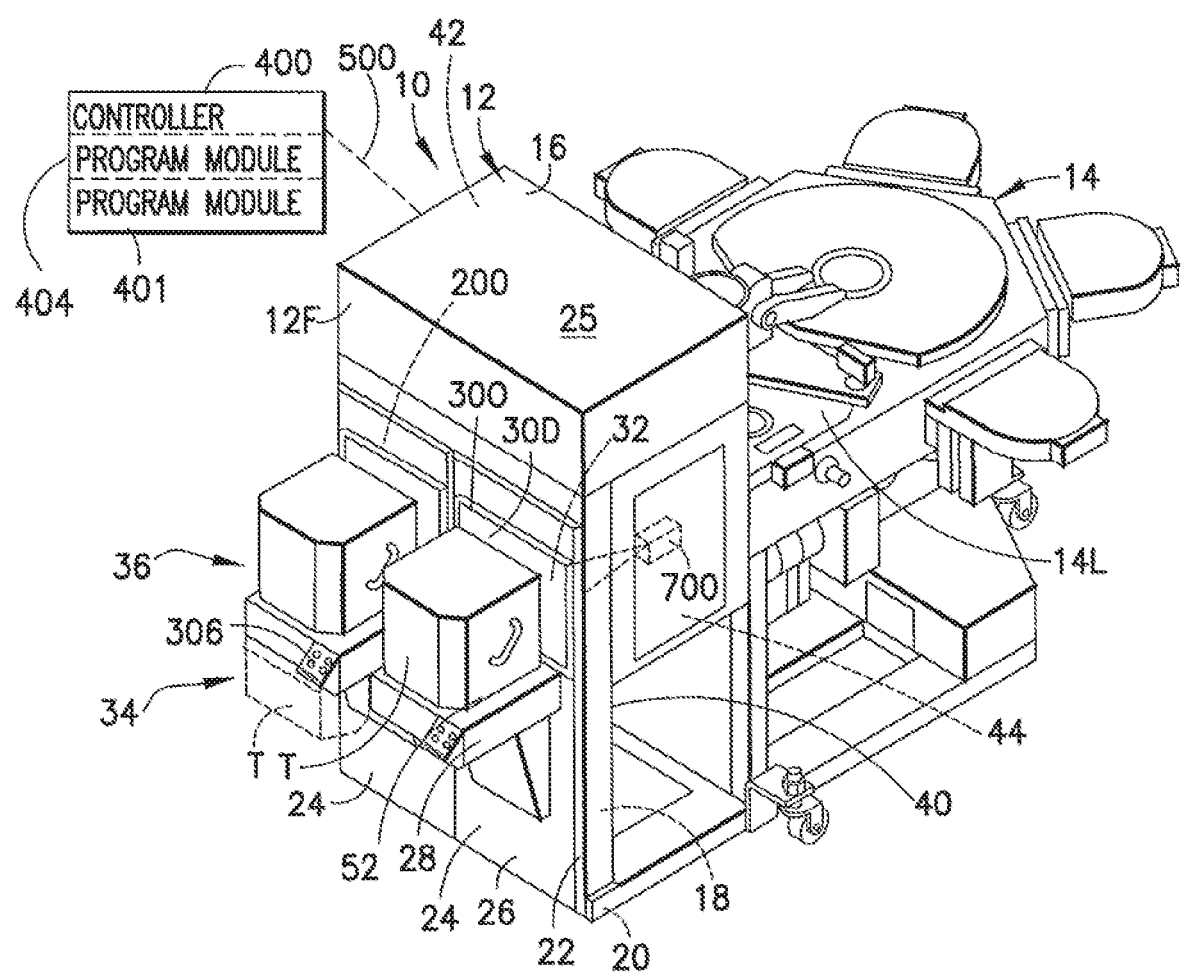
FIG. 1 is a schematic perspective view of a substrate processing apparatus, incorporating features of the present invention in accordance with one exemplary embodiment, and substrate transport containers T.

Referring to FIG. 1, a perspective view of a substrate processing apparatus 10 incorporating features of the present invention is illustrated. Although the present invention will be described with reference to the embodiment shown in the drawings, it should be understood that the present invention can be embodied in many alternate forms of embodiments. In addition, any suitable size, shape or type of elements or materials could be used.

In the embodiment illustrated in FIG. 1, the apparatus 10 has been shown, for example purposes only, as having a general substrate batch processing tool configuration. In alternate embodiments, the substrate processing apparatus may have any other suitable configuration, as the features of the present invention, as will be described in greater detail below, are equally applicable to any substrate processing tool configuration including tools for individual substrate processing. The apparatus 10 may be capable of handling and processing any desired type of flat panel or substrate such as 200 mm or 300 mm semiconductor wafers, semiconductor packaging substrates (e.g. high density interconnects), semiconductor manufacturing process imaging plates (e.g. masks or reticles), and substrates for flat panel displays. The apparatus 10 may generally comprise a front section 12 and a rear section 14. The front section 12 (the term front is used here for convenience to identify an exemplary frame of reference, and in alternate embodiments the front of the apparatus may be established on any desired side of the apparatus). The front section 12 has a system (as will be described in greater detail below) providing an interface allowing the importation of substrates from the fab into the interior of the apparatus 10. The front section 12 also generally has a housing 16 and automation components located in the housing handling substrates between the rear section 14 and the front section interface to the exterior. The rear section 14 is connected to the housing 16 of the front section. The rear section 14 of the apparatus may have a controlled atmosphere (e.g. vacuum, inert gas), and generally comprises a processing system for processing substrates. For example, the rear section may generally include a central transport chamber, with substrate transport device, and peripheral processing modules for performing desired manufacturing processes to substrates within the apparatus (e.g. etching, material deposition, cleaning, baking, inspecting, etc.). Substrates may be transported, within the fab, to the processing apparatus 10 in containers T. The containers T may be positioned on or in proximity to the front section interface. From the containers, the substrates may be brought through the interface into the front section 12 using automation components in the front section. The substrates may them be transported, via load locks, to the atmospherically controlled rear section for processing in one or more of the processing modules. Processed substrates may then be returned, in a substantially reversed manner, to the front section 12 and then to the transport containers T for removal.

The front section 12, which may otherwise be referred to as an environmental front end module or EFEM, may have a shell or casing defining a protected environment, or mini-environment where substrates may be accessed and handled with minimum potential for contamination between the transport containers T, used to transport the substrates within the FAB, and the load locks 14L providing entry to the controlled atmosphere in the rear processing section 14. Load ports or load port modules 24 (one or more in number as will be described further below) are located on one or more of the sides of the front section providing the interface between the front section and FAB. The load port modules may have closable ports 300 forming a closable interface between the EFEM interior and exterior. As seen in FIG. 1, the load port modules may have a support area for a substrate transport container T. A secondary holding area may also be provided under the support area, where transport containers may be temporarily buffered. The transport container support area may allow automated movement of the transport container T supported thereon to a final or docked position. Proper placement of the transport container T on the support area, before movement, may be detected and verified with detection switches integral to the cover or casing of the support area. Positive engagement or lock down, again prior to movement, of the transport container, in the load port support area may be achieved with actuated clamps of the load port as will be described further below. Transport of the transport container on the support area of the load port to the final or docked position (i.e. the position of the transport container proximate to the port through which substrates are transported between the transport container and the interior of the EFEM casing interior) may be detected by a touchless (i.e. contamination free) position sensor. In cooperation with the apparatus control system, the position sensor operates to repeatedly establish the transport container docked position with minimal clearance between container and load port frame despite the tolerance variation in the dimensions of the transport container, as will be described further below. Also, as will be described below, pinch detection during automated movement of the transport container may be provided by one or more sensors monitoring current to the transport motors. The pinch sensors are connected to the control system, that has programming to automatically stop and reverse direction of travel upon receiving an appropriate signal from the pinch sensors. The port door, of the load port module, may engage the transport container when in the docked position in order to open the transport container while, as will be seen further below, also opening the access port 300 in the load port frame, to provide access to substrates within the transport container as well as access for transporting the substrates between the container and EFEM interior. Engagement between the port door and transport container may be effected by independently operable keys with independent sensors for detecting improper engagement or operation as will be described below. The port door may be mounted on a resiliently flexible mount stably supporting the door while providing the door with sufficient range of motion when opening to clear the access port frame or other load port module structure obstructions. Additional movement of the door to open the port for substrate transport may be accomplished with a drive that is pivoted into a position so that door movement, when opening/closing, is substantially parallel with the face of the EFEM. The load port module may have a sensor for detecting the presence of substrates inside the transport container. The sensor is actuated to access the transport container interior and moved to scan the interior of the transport container simultaneous with the movement of the port door to open the access port. The sensor is connected to the control system to identify presence, position and orientation of the substrates inside the transport container. Another feature, as will be described further below, is that the load port module may be an intelligent load port module. The load port may have an integrated user interface, communicably connected to the control system, controllers and sensors, allowing a user to locally input data, information, and programming for operation and health status monitoring of the processing apparatus. The user interface may have a graphics display integrated to the load port module capable of graphically displaying information regarding desired operational status and health status data of the apparatus, as well as any desired accessible information available in the control system. The user interface may have suitable I/O ports for connecting peripheral devices, such as a teach pendant, and allowing bi-directional communication with the peripheral devices when connected to the user interface. The load port module may further be provided with a camera located for viewing motions of desired automation components. The camera may be communicably connected to the control system, which is suitably programmed to identify from the camera signal errors in the motions of the automation components. The display of the user interface may display the view frames or video stream generated by the camera.

Figure 2:
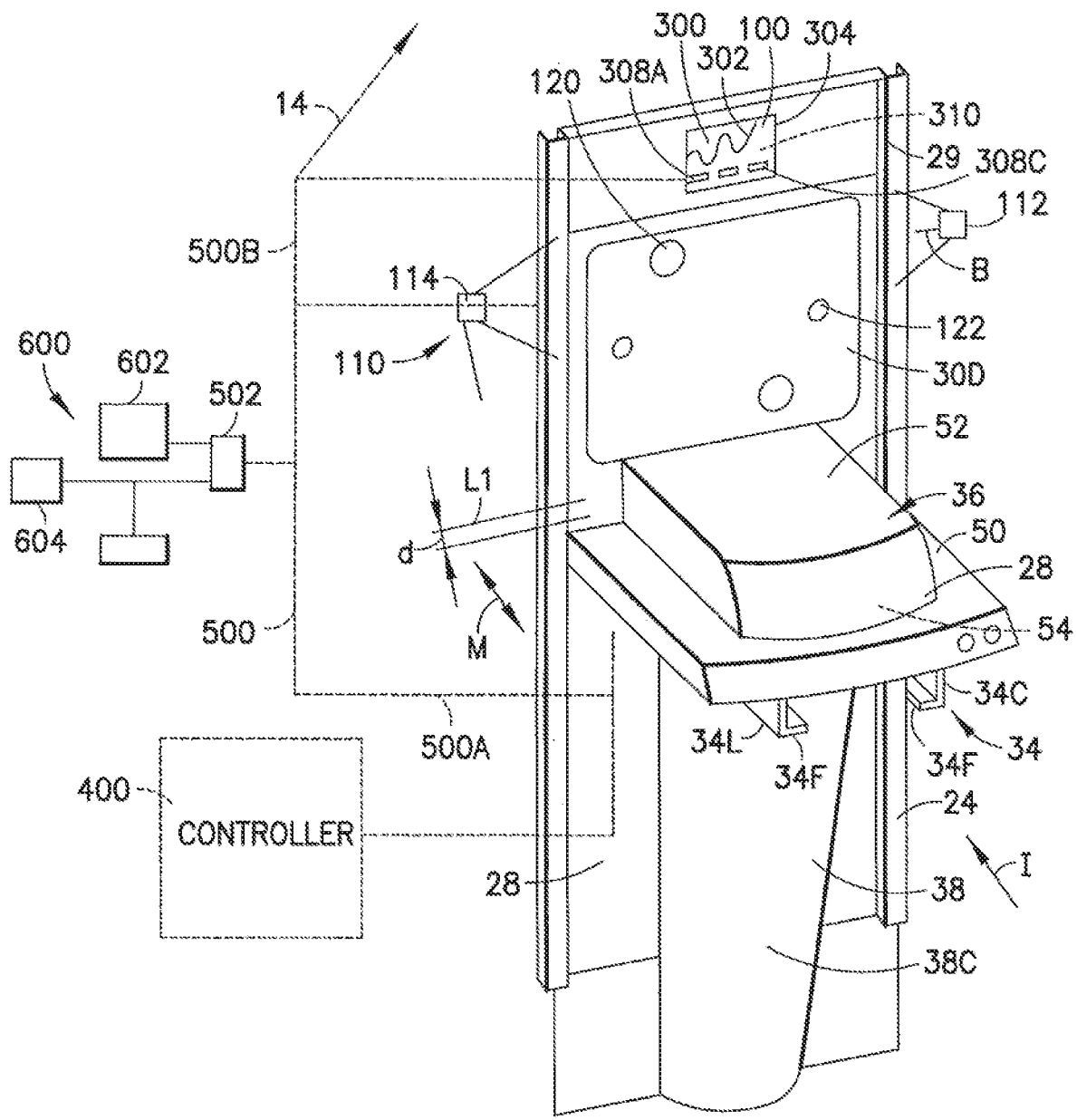
FIG. 2 is a partial perspective view illustrating the front of a load port module of the processing apparatus in FIG. 1.

In greater detail now, and with reference also to FIG. 2 which is a perspective view of the load port module 24 of the processing apparatus in accordance with this exemplary embodiment, the load port module 24 has a frame 29 that may generally define (as noted before) a transport container holding or support area 28 and a closable port 300 through which substrates are transported in and out of the mini-environment inside the front section housing 16. The housing 16 and load port module 24 of the EFEM are connected, as will be described further below, to form a chamber or space 25 that is substantially closed from the exterior, and as noted before, provides a controlled or mini-environment within the front section 12. For example, the front section may include a controlled air flow system (not shown), such as vents, louvers, laminar flow system, to avoid particulate contamination from entering the mini-environment in the front section 12. As seen in FIGS. 1 and 2, the transport container holding area 28 of the load port module 24 may have a primary or first station 36 and a secondary station 34. In this embodiment, each station 36, 34 of the holding area 28 may be capable of holding a transport container T, though in alternate embodiments, the transport container holding area may have more or fewer holding stations, and each holding station may be capable of supporting any desired number of substrate transport containers. The transport container T shown seated on the holding stations 36, 34 are depicted for example purposes as being front opening uniform pods (FOUPs) style containers, though in alternate embodiments, the holding stations of the load port holding area may be capable of supporting any desired type of transport container such as SMIF containers. In the embodiment shown in FIG. 1, the front section 12 has the load port modules 24 located on the front face 12F of the front section 12 for example purposes. In this location, the load port module 24 may be positioned to facilitate placement and removal of transport containers T, onto at least one holding station 34, 36 of the load port module holding area 28, using an automated material handling system (AMHS) (not shown), such as AeroLoader® from Brooks Automation, Inc. As seen in FIGS. 1-2, the load port module holding area projects forwards from the face 12F of the front section, and access for removal/placement, with the AMHS, of the transport containers T onto the holding area 28 may be from the top or front. In alternate embodiments, the load port module may be located on other sides of the front section as desired. In still other alternate embodiments, the load port modules may be located on two or more sides of the front section 12. As seen in FIG. 2, the load port module 24 in this exemplary embodiment may have an extension zone 38 projecting outwards from the base plate of the load port module 24.

Figure 3:
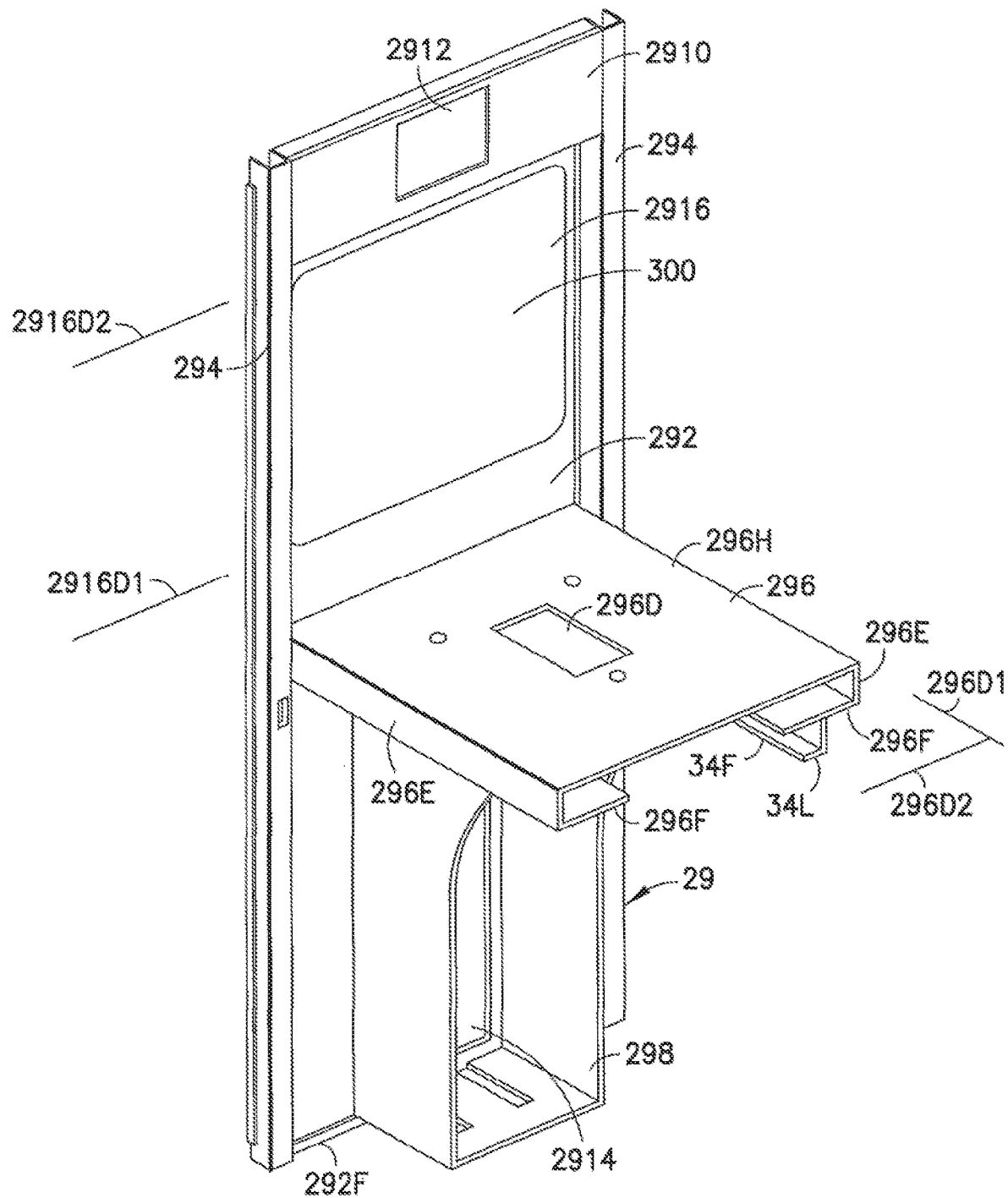
FIG. 3 is another partial perspective view of a frame of the load port module in FIG. 2.

Referring now also to FIG. 3, there is shown a perspective view of the frame 29 of the load port module 24. In the exemplary embodiment, the frame 29 may comprise a base plate 292 and stiffener rails 294. The base plate 292 and rails 294 may be made of steel, such as any commercially available standard structural steel (e.g. ASTM A36) rolled or stamped plates or sections of desired thickness to suit the anticipated loads on the frame. If desired, the base plate and rails may be made of high-strength steels (e.g. ASTM A242) in order to further reduce the weight of the load port modules. In alternate embodiments any desired metal may be used. The base plate 292 may be sized as desired relative to the dimensions of the mounting face 12F of the front section 12. In the embodiment shown in FIG. 1, the front section 12 has two load port modules 24 that are substantially the same, (though in alternate embodiments the front section may have fewer or more load port modules as desired). Accordingly, the frame 29 of each load port modules 24 may extend for example about half the width of the front section. The height of the base plate 292 may extend for example the full height of the front section, or some lesser portion thereof to allow proper interface and seal with the front section housing 16. As seen in FIG. 3, the rails 294, which are illustrated as having a general channel cross-section for example purposes, are placed at the lateral edges of the base plate 292 in this exemplary embodiment. In alternate embodiments, the rails may have any desired standard rolled or stamped section (e.g. T, angle, etc.) and may be located as desired on the base plate to provide the frame with the desired strength and flexural stiffness. If the desired shape/size is not standardly available, the desired shape/size may be readily formed by cutting part of one or more flanges on a standard section. In this embodiment, the base plate 292 may have raised flanges 292F (see FIG. 3) at one end and may be shaped (e.g. by stamping or rolling) to form an outward projecting channel 2910 at another end. The rails 294 and raised flanges 292F and channel 2910 may be connected to form a general structural box configuration (which minimizes frame warping) and provides a self supporting structure. In alternate embodiments, the base plate may be shaped in any other desired manner, and the rails, which may be more or fewer in number, may be positioned as desired to provide the desired structural properties. In this embodiment, the base plate 292 and rails 294 may be welded together, such as by SMAW, MIG or TIG welding. The welds may be spot or continuous welds. In alternate embodiments, the base plate and rails may be structurally joined by and desired means such as brazing, pressure or chemical bonding or mechanical fastening. In still other embodiments, the frame base plate and rails may be integrated during formation of the frame, so that the frame is a one-piece member of unitary construction. As a self supporting structure, the frame around the load port module (LPM) 24 to be transported, with all LPM components (described below) mounted to the frame, as a unit with no further brazing or support to maintain structural adequacy.

As seen best in FIG. 3, in this embodiment the base plate 292 has opening 2912, formed in portion 2910, and opening 2914 formed in the lower portion of the plate. As noted before, an opening 2916 is also formed in the base plate 292 defining the access port 300 of the load port modules. Opening 2912 may be centered on the base plate center line, and is sized to suit a graphics display of the user interface 102 (see FIG. 2) as will be described in greater detail below. In alternate embodiments, the display opening may have any suitable location, size and shape for locating and mounting a graphics display to the frame. As seen in FIG. 3, the opening 2914, in embodiment the lower portion of the base plate, is substantially surrounded by generally box shaped wall 298. The box shaped wall 298, may be made of sheet metal, such as steel, and may be joined to the base plate 292 by spot welding, chemical bonding or any other desired means. The box shaped wall 298 may be located in extension portion 38 (see FIG. 2) of the load port module. The box shaped wall 298 may form a casement and support for the operating mechanism of the access port door 30D (see FIG. 1) as will be described further below. In this embodiment, and as will be seen further below, the door operating mechanism extends through opening 2914 for engagement with the door. Locating the door operating mechanism within the extension portion 38, removes or at least minimizes the space dedicated for the door operating mechanism within the front section housing 16. This in turn may allow reduction of the size of the front section housing 16 compared to conventional apparatus.

In this embodiment, the opening 2914 in the base plate may not be closed or sealed, resulting in free communication between the interior of the front section housing 16 and space within box walls 298. The box walls 298 may be covered by flashing or cover 38C (see FIG. 2) that closes the front side of box walls 298. The cover 38C may be sealed to base plate 292 or other structure of the load port, so that when the load port modules 24 are connected to front section housing 16, the mini environment within the front section may extend through opening 2914 into the extension region 38 of the load port modules. In alternate embodiments, the frame of the load port module may not have an opening for the door operating mechanism to extend through the frame. As will be described in greater detail below, a portion of the frame 29 may be removably mounted to provide ready access to LPM components.

Still referring to FIG. 3, the frame 29 has support structure 296 for the transport container holding area 28. The support structure 296 may be formed by rolling, stamping or bending steel (or any other desired metal) plate or sheet into the desired configuration. In the embodiment shown, the support structure is formed to have a flanged channel configuration with a flat upper section 296H, vertical end walls 296 and inwardly projecting flanges 296F. Structure 296 may be of unitary construction, such as when formed by bending a single piece of sheet metal into the desired configuration. In alternate embodiments, the support structure may be a weldment or assembly of a number of pieces such as for example forming the structure into two similar pieces joined at a center seam line by welding, brazing, bonding or fastening. After formation of structure 296, it may be attached to the base plate 292 of the load port frame by any suitable means including spot welding, brazing, bonding or mechanical fastening. As shown in FIG. 3, the support structure 296 is located above the box wall 298, and if desired the box wall may be extended and joined to the support structure 296, thereby providing increased rigidity to the frame 29. The support structure 296, in this embodiment may also be extended so that it is tied in structurally, for example by welding, to the rails 294 bounding the lateral sides of the base plate again for increased rigidity. In alternate embodiments, the transport container holding area support structure may not be joined to the side rails of box wall of the load port module frame. Fabrication of the load port module frame 29 using standard commercial plate and standard section members to the greatest extent possible, as described above, significantly reduces the cost and time associated with fabrication of the load port module frame compared to conventional apparatus. Conventional fabrication of load port module frames generally uses members either machined to the final configuration from stock billet, or otherwise especially cast or formed into the final shape, that are joined together mechanical fastening to form the frame.

Figure 4:
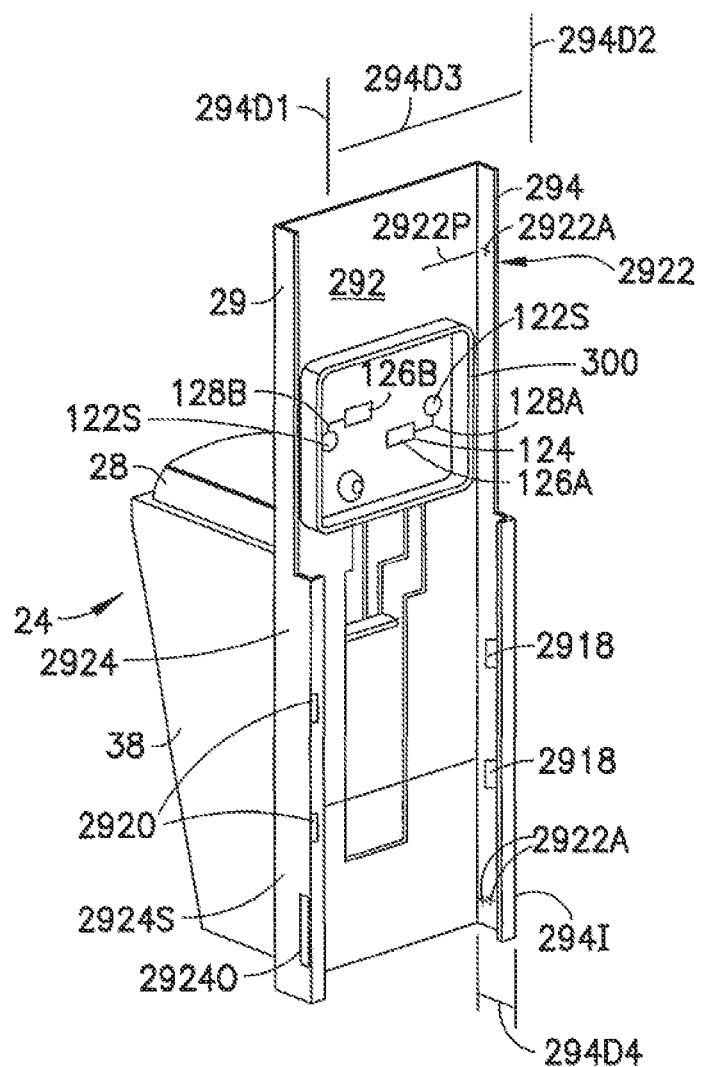
FIG. 4 is a perspective view illustrating a rear side of the load port module in FIG. 3.

Referring now also to FIG. 4, there is shown another perspective view of the load port module 24 as seen from a direction (rear) opposite to that in FIG. 2. As seen in FIGS. 3 and 4 the frame 24 may be provided with controlled or datum surfaces 296D1, 296D2, 294D1-294D4 to provide proper orientation and alignment between interfacing items mounted to or placed on the load port module frame, as well as provide proper orientation and alignment of the load port module 24 itself (and any components mounted thereto) and any other interfacing components of the front or rear sections 12, 14 of the apparatus. For example, datum surfaces indicated by lines 2916D1, 2916D2 may be established around the edges of the access port hole 2916 in base plate 292. The surfaces at the edges of the hole 2916 may be contacted by the port doors 30D (see also FIG. 2) when the port is closed, and it is desired that flatness as well as planarity (relative to both vertical and horizontal axis) of the surfaces be controlled. The transport container holding area support structure 296 may also be provided with datum surface, such as for example 296D1, 296D2 that establish the flatness as well as orthogonality of the support structure 296 relative to for example the datum surfaces 2916D1, 2916D2 at the access port. This helps ensure proper and repeatable alignment for interface between any transport container positioned on the holding area 28 and the door of the access port as will be described further below. As seen in FIG. 4, datum surfaces/lines 294D1-294D4 may be provided on the rear side of the load port modules frame to control the flatness and planar orientation of the surfaces 294I interfacing the load port module 24 to the housing. The interface surfaces 294I may be provided with a BOTLS type interface (not shown) for securing the load port module 24 and front section housing 16 to each other. In alternate embodiments, the load port module may have any other desired interface type. Regardless of the type of interface, the system of datum surfaces/lines 294D1-294D4 on the rear side of the load port module frame provide a reference system enabling repeatable alignment of the load port module 24, and components mounted thereto, to the front or rear sections 12, 14 of any apparatus similar to apparatus 10. This enables load port modules with frames similar to frame 29 to be interchanged between different apparatus. The datum surfaces on the frame 29 may be provided, if desired after completion of fabrication of the frame, by local machining or any other desired means. The surfaces may be identified by using a test bench or jig, or using an optical alignment system. Machinable stock or shims may be provided as desired to build up surfaces prior to forming the datum surfaces. An adapter (not shown), an example of which is discussed in U.S. patent application Ser. No. 09/600,829, filed Feb. 11, 1999 incorporated herein by reference, may be used to interface the load port module 24 to the casing 16 of the EFEM.

As seen in FIG. 4, the load port modules frame 29 may include integral mounting surfaces and structures 2918, 2920 for supporting desired automation components located in the front section mini-environment. As noted before, the front section 12 of the processing apparatus may include various automation components used in the transfer of the substrates between the transport container T (seated on the load port modules as shown in FIG. 1) and the rear section 14 of the apparatus 10. By way of example, in this embodiment, the front section 12 may include automation components such as a transport container mapper 200 (see also FIG. 6), a substrate transport apparatus 40 (see also FIG. 5) an aligner 42 (see also FIG. 5), and a substrate buffer 44. The mapper 200, will be described in greater detail below, but is positionable to map the substrates located inside the transport container T on the holding area 28. The substrate transport apparatus 40 is shown schematically in FIG. 5. The transport apparatus 40 may generally include a transport portion 40A capable of holding and transporting a substrate in θ (rotational) and R (radial) motion (as indicated by the θ and R arrows in FIG. 5). If desired, the transport apparatus 40 may also include a lateral carriage system 40C capable of moving, in this embodiment, portion 40A laterally across the load port module as indicated by arrow L in FIG. 5. The θ, R movement portion 40A may be of any suitable type and configuration such as a SCARA type arm. Transport portion 40A has been illustrated schematically in FIG. 5, as having a SCARA type configuration (only two links of the arm are shown, the end effector is omitted for clarity) for example purposes. A suitable example of a SCARA type arm that may be used in the apparatus 10 is the AcuTran 7 Robot from Brooks Automation, Inc. In alternate embodiments, the θ, R movement transport portion may have any other desired configuration. The transport portion 40A may be movably held in a housing or casing 40A1 with a drive for moving the transport portion 40A in the vertical or Z direction as indicated by the arrow Z in FIG. 5). The casing 40A1 may be mounted on the carriage (not shown) of the lateral carriage system 40C. The aligner 42 (shown in phantom in FIG. 5) may be of any suitable type, such as the Brooks Automation Inc. AcuLigner 7. The aligner 42 is positioned to allow the transport apparatus 40 to pick/place substrates thereon. The buffer 44, may have any suitable configuration allowing buffering of a desired number of substrates inside the front section 12. In alternate embodiments, the front section may have other different types of automation components, or more or fewer of similar automation components (e.g. more than one mapper, aligner). As noted before, in this embodiment the mapper 200, transport apparatus 40, aligner 42 and buffer 44 may be mounted (either directly or indirectly) to the load port module frame 29 to be integral to the load port module 24. Accordingly, installation or removal of the mapper, transport apparatus, aligner and buffer module to and from the front section 12 is accomplished upon installation or removal of the load port module itself. In addition, one or more of the load port module components, for example the transport apparatus, aligner and buffer may be mounted on a sub-module (not shown) or the load port module 24 that may be removed and installed onto the LPM when the LPM is mounted to the casing 16. Another example of what a removable sub-module for the LMP is described in U.S. Provisional Application 60/579,862, filed Jun. 15, 2004 and incorporated by reference herein in its entirety.

As shown in FIG. 4, mounting surfaces or structures 2918, 2920 (shown schematically in FIG. 4) for the transport apparatus 40 depend from the frame 29. The surfaces or structures 2918, 2920 may be formed in any suitable manner, and in the embodiment shown in FIG. 4, are located on the rails 294 of the frame. In alternate embodiments, the transport apparatus mounting surfaces/structures may be located on any other desired portion of the frame with the desired strength and stiffness. The mounting surfaces 2918, 2920 may be positioned relative to the reference datums 294D1-294D4 of the frame 29, and may provide attachment points for the lateral carriage system 40L, or in the cases where the transport apparatus does not include the lateral carriage system, for the casing 40A1 of the θ, R movement transport portion 40A. Similarly, mounting structure 2923C (see FIG. 5) may be provided for mounting the aligner 42 to the load port module, as well as mounting structure (not shown) for mounting the buffer to the load port module frame. These support structure are also positionally controlled to the reference datums 294D1-294D4 of the frame, within desired tolerances. The frames 29 of the load port modules, and hence the load port modules may thus be fully interchangeable with other similar load port modules.

Figure 5:
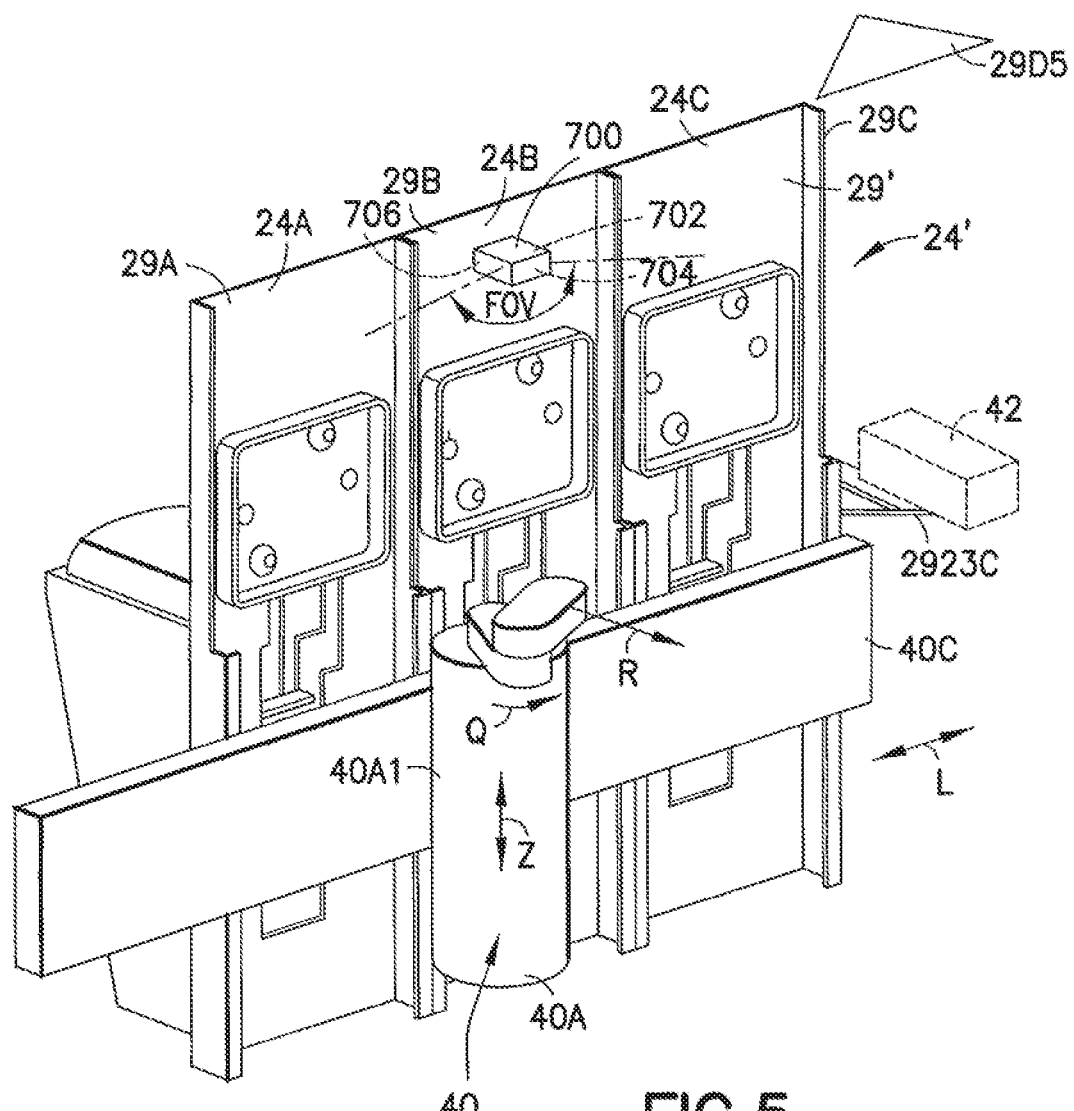
FIG. 5 is another perspective view illustrating the load port module in accordance with another exemplary embodiment of the present invention.

The load port module frame 29 further comprises lateral interface systems 2922, 2924 (see FIG. 4) allowing the load port modules to be attached side by side forming a super or compound module 241 as shown in FIG. 5. In this embodiment, one lateral interface system 2922, 2924 is provided on each of the lateral sides of the load port module 24. Accordingly, other modules may be attached to either or both sides of the load port module frame. The interface system 2922, 2924 between load port modules may include alignment means 2922A, 2922P (only the alignment means for system 2922 are shown, though system 2924 is similar) to align the modules being attached to each other. For example, in this embodiment the alignment means may include holes 2922A precisely located relative to desired datums, such as datums 294D2, in rails 294. Three holes 2922A are shown in FIG. 4, though in alternate embodiments the alignment means may include any desired number of holes. The alignment means may further include dowel or fitted pins 2922P for insertion into each of the holes 2922A (only one pin 2922P is shown in FIG. 4 for example purposes). The corresponding pins 2922P may be inserted through respective alignment holes 2922A in the frame 29 of one load port module and through the matching holes (not shown) similar to holes 2922A in the adjoining load port module frame. This establishes alignment of adjacent load port modules to each other and to the global reference. After alignment, the local reference datums (forming a datum plane for each load port module as exemplified by reference datums 294D1-294D3 for frame 29) are substantially co-planar with the reference datum plane 29D5 of the super module shown in FIG. 5. The interface systems 2922, 2924 may also include lateral seating surfaces (only surface 2924S is visible in FIG. 4) and seals 2924O. The seating surfaces, such as surface 2924S allow the adjacent load port modules to be abutted together, and seals 2924O (which may be formed from any suitable elastomer, or viscoelastic material) seal the gaps between adjacent frame members to maintain the mini-environment across the face of the compound module. A fastening system (not shown) of mechanical fasteners for example, or attachment by welding, or bonding may be used to secure load port modules to each other. In this manner any desired number of load port modules 24 may be attached side by side.

FIG. 5 is a perspective view of a compound load port module 24' formed by attaching a number of load port modules 24A, 24B, 24C side by side. In the embodiment shown, the compound module 24' include three individual load port modules 24A, 24B, 24C. In alternate embodiments, the compound module may be formed from any desired number of individual load port modules. Load port modules 24A, 24B, 24C are substantially similar to load port module 24 described before and shown in FIGS. 2-4. The load port modules 24A, 24B, 24C are attached to each other with interface systems similar to interface systems 2922, 2924 (see FIG. 4) that both align the individual modules to reference datum plane 29D5 (as described before) and join the individual modules to form a single integrated unit. The frame 29' of the compound module 24' is the integrated composite of frames 29A, 29B, 29C of the individual modules. The compound load port module 24' may thus be installed, or removed as a unit, along the combined automation components 40, 42 attached thereto, from the front section 12 of the apparatus. In the embodiment shown in FIG. 5, the transport apparatus 40 may be mounted to mounting structures similar to mounting structures 2918, 2920 of one or more of the module frame 29A, 29B, 29C. The lateral carriage system 40C in this embodiment extends along all three modules 24A, 24B, 24C. Accordingly, the transport portion 40A is capable of traversing (in the direction indicated by arrow L) the entire width of the compound module 24. In alternate embodiments, one or more of the modules, in the compound module, may have a dedicated transport apparatus mounted thereto. In the embodiment shown in FIG. 5, module 24C has support structure 2923C for mounting aligner 42. In alternate embodiments, the aligner support structure may be on any of the individual modules forming the compound module. As noted before the frames of individual modules 24A, 24B, 24C enable the modules to be tied together, without any additional frame support members, to form compound modules of any desired width (as shown in FIG. 5). Nevertheless, the frame 29 of each individual module 24, 24A, 24B, 24C enables each module to be independently mounted to the front section housing 16.

Figure 9A:
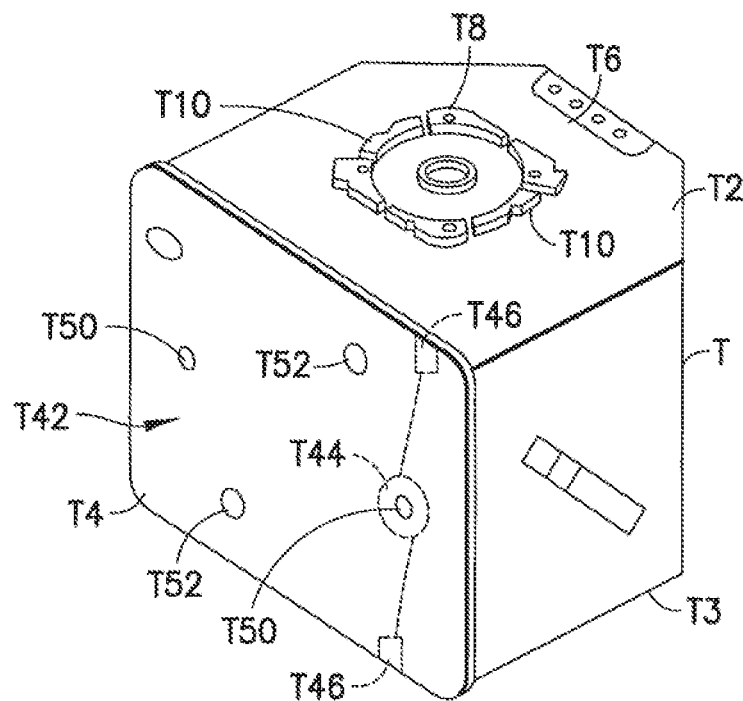
FIGS. 9A-9B respectively are a perspective view of an exemplary substrate transport container T, according to the prior art, as it appears from different directions.
Figure 9B:
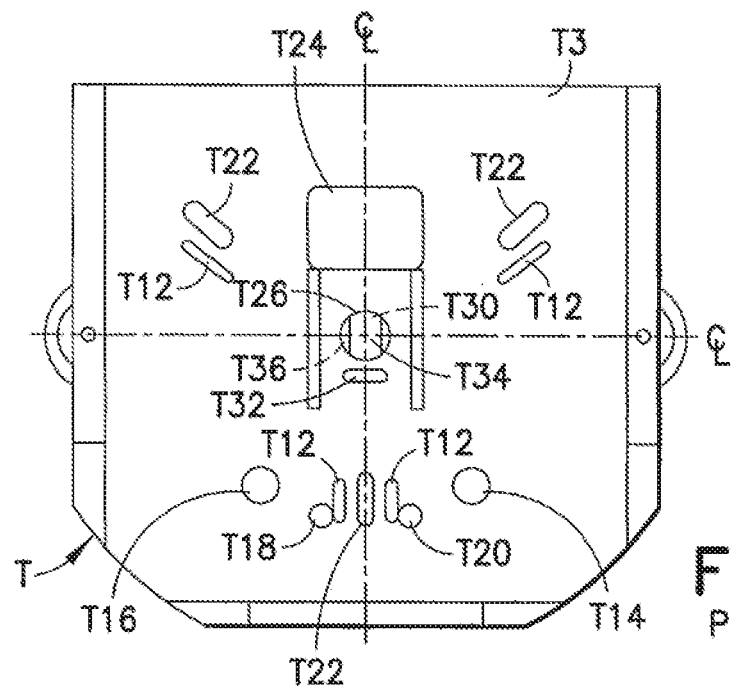

Referring again to FIGS. 1-3, the transport container holding area 28, of the load port module 24 may have both an upper 36 and lower 34 support station, each support station 36, 34 may be capable of holding or supporting a transport container T as shown in FIG. 1. In this embodiment, the lower station 34 is located generally under the upper station 36. The lower station 34 may comprise opposing members 34L (only one of which is shown in FIG. 3) capable of conformally engaging structure of the transport container T so that when placed in the lower station 34, the transport container is supported from members 34L. FIGS. 9A-9B respectively are front and bottom perspective views of an exemplary substrate transport container T. The container T in FIGS. 9A-9B is shown as having FOUP type configuration. In alternate embodiments, the substrate container may have any other desired configuration as seen best in FIG. 9A, transport container T generally has a casing T2 and a casing cover or door T4 removably connected to the casing. The casing T4 has an upper surface T6 with a fixture T8 projecting therefrom. The fixture T8 may include lateral flanges or outwardly projecting seating surfaces T10 that are offset a distance from the upper surface T6 of the casing. The seating surfaces T10 may be part of a handling flange conforming to SEMI; E47.1-1001. The seating surfaces T10 may serve for engaging the coupling portion (not shown) of a container transporter of an automated material handling system (such as AeroLoader®) and thereby supporting the container from the transporter. Referring again to FIGS. 2-3, the support members 34L of the lower station 34 on the load port module holding area 28, are shown in this embodiment as having an angle or general L shaped configuration. The members 34L have inward projecting flanges 34F as shown. In alternate embodiments, the support members 34L may have any other suitable shape. The support members 34L may be for example metal, plastic, or any other suitable material, and may be connected as shown in FIG. 3 to support structure 296 of the load port frame 29. The inwardly pointing flanges 34F are sized to be admitted between seating surface T10 (see FIG. 9A) on the transport container and upper surface T6 of the container. The flanges 34F of the opposing members 34L are sufficiently separated to allow insertion of support fixture T8 of the container T between the flanges with the outward projecting seating surfaces T10 overhanging (at least partially) the corresponding flanges 34F. Accordingly, when loaded into the lower station 34, the transport container T is supported by seating surfaces T10 seated on the flanges 34F.

In this embodiment, the transport container T may be manually positioned by an operator on the lower station 34, by inserting the container (in the direction indicated by arrow I in FIG. 2) so that fixture T8 is moved in between flanges 34F. In alternate embodiments, the support members of the lower support station may have any other desired orientation to allow the transport container to be positioned from any other desired direction. Removal of the transport container T from the lower station 34 may be accomplished in a substantially reverse manner, with the user manually withdrawing the container in the opposite direction from installation. The lower support station 34 provides the load port module with another container stowage location where the user may place a transport container T in the case when the upper support station 36 is either occupied by another transport container or is in some state (such as testing) preventing placement of the transport container T on the upper station. As noted before, in alternate embodiments, the load port module may not have a lower support station in the transport container holding area 28.

Referring now again to FIG. 2, the upper support station 36 of the transport container holding area 28 on load port module 24, generally comprises a base support or shelf 50 and a carriage or shuttle 52 movably mounted on the shelf. A shuttle drive system 54 operably connects the shuttle 52 to the shelf 50 and is capable of moving the shuttle 52 on the shelf. The drive system 54 moves the shuttle (in the direction indicated by arrow M in FIG. 2) between a first position and a second position. As will be described further below, the shuttle 52 is configured to allow placement of a transport container T thereon. The first shuttle position may be disposed such that the transport container T may be positioned automatically on (or picked off) the carriage by the automated material handling system (not shown). The second position to which shuttle 52 may be moved, is located so that the transport container T on the shuttle may be docked to the door 30D (see FIG. 1) as will be described further below. When the shuttle is in this second position, the transport container T thereon is located in what will be referred to for convenience purposes as the docked location. The controller 400 is communicably connected to sensors on the shuttle and the drive system as will be described further below.

As seen in FIG. 1, the transport container T is placed on the shuttle 52 with the bottom surface of the container seated on the shuttle. The shuttle 52 is hence configured, as will be described further below to conformally engage the bottom of the transport container T. FIG. 9B is a bottom view illustrating features of the bottom T3 of the exemplary substrate transport container T. In this embodiment, the bottom T3 of the transport container has features generally conforming to specification in SEMI E47.1. In alternate embodiments, the bottom of the substrate transport container may have any other desired features. In this case bottom T3 generally includes carrier sensing pads T12, one each of a front end of line (FEOL) and back end of line (BEOL) information pads T14, T16, a carrier capacity (i.e. number of substrate holding locations) information pad T18 and a box or cassette information pad T20. The container bottom T3 may further include slots T22 for engagement by locating/kinematic coupling pins on the shuttle. A first recess T24 into the bottom surface is provided as a first retention feature. The bottom of the container also has a second retention feature T26 formed therein. The second retention feature generally comprises a generally circular recess T30 formed into the bottom that has an outer aperture T32 with substantially squared off edges T34 (forming engagement lips T36).

Figure 7A:
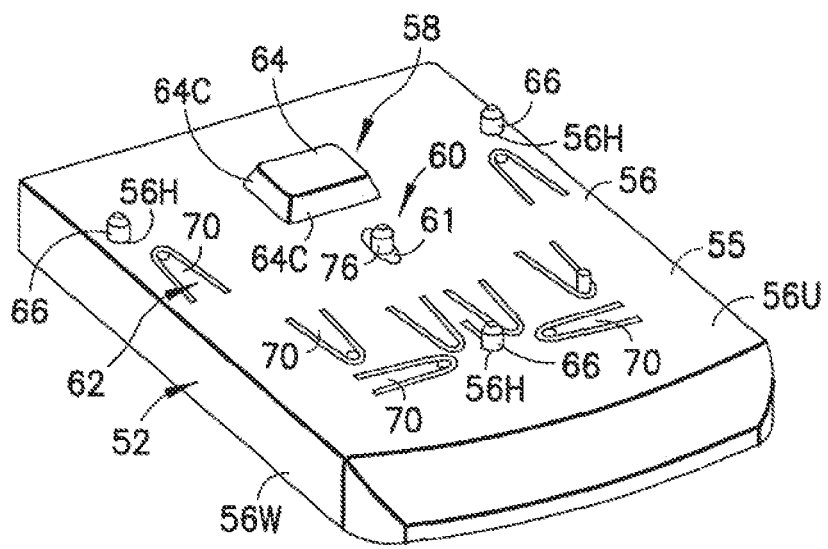
FIGS. 7A-7D respectively are a perspective view of a transport container support of the load port module in FIG. 3, a top plan view of the support, and front and side elevation views of the support.
Figure 7B:
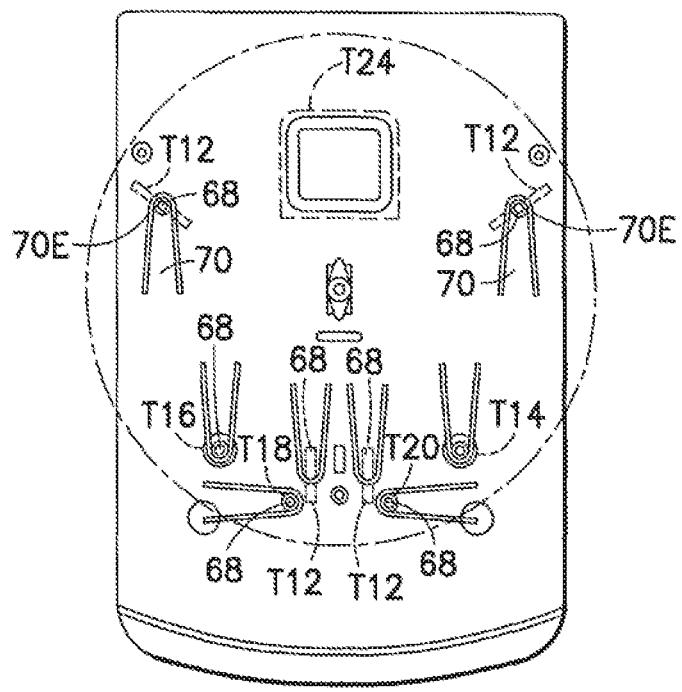
Figure 7C:
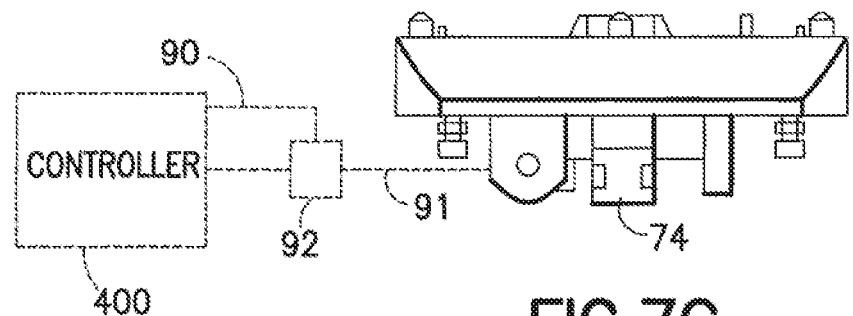
Figure 7D:
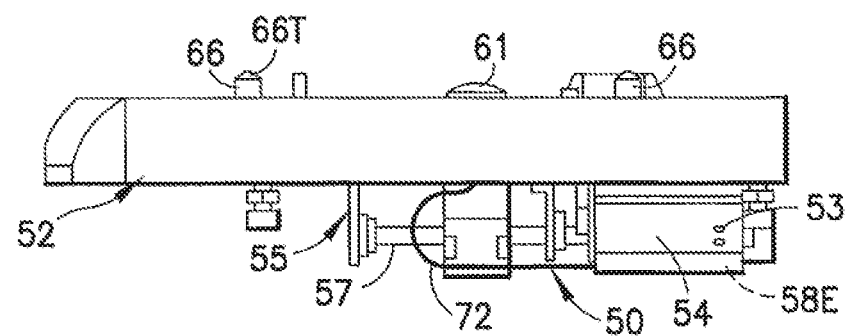

FIGS. 7A-7D, are respectively a schematic perspective, a top plan, front and side elevation views of the shuttle 52 and part of the support shelf structure on which the shuttle sits (the support shelf structure 50 is visible only in FIGS. 7C-7D). The shuttle 52 generally comprises a chassis or frame 55 and a cover 56 positioned over the chassis. The shuttle 52 may also generally have locating features 58 for helping locate the container T properly onto the shuttle, coupling features 60 for positive coupling of the seated container T to the shuttle, and detection system 62 for detecting the presence and accurate placement of the container T on the shuttle 52. Referring now also to FIG. 8, showing a partial cutaway view of the shuttle 52, chassis 55 may have any suitable shape, and may be made from any suitable material, able to support the static and dynamic loads associated with placement and removal of the transport container T on the shuttle as well as movement of the container and shuttle between the first and second positions. The chassis 55 may have a motion system (not shown) such as rollers or slides allowing free movement of the shuttle 52 (in the direction indicated by arrow M in FIG. 2) relative to the support shelf 50 of the load port module frame. Support shelf 50, shown partially in FIG. 8, (see also FIG. 2) may be formed by support structure 296 of frame 29 (see FIG. 3). The shelf 50 may include tracks or rails (not shown), formed on or depending from frame structure 296 (for example the top plate 296H or side plates 296E) on which the motion system of the chassis 55 rides. The container locating features 58, coupling features 60, detection system 62 and cover 56 are mounted to the chassis 55.

As seen best in FIGS. 7A-7B, in this embodiment container locating features 58 on shuttle 52 may include a projecting engagement member 64. In this embodiment, the engagement member 64 may have a general frusto-pyramidal shape, generally conformal to the shape of locating recess T24 (see FIG. 9B) in the bottom T3 of the container. The engagement member 64, may be anchored to the chassis 55, and project through a suitable opening in the cover 56 sufficiently above the upper surface 56U of the cover to engage the locating recess T24 in the container when the container T is seated on the shuttle 52. The engagement member 64 may have cam surfaces 64C for cooperating with the edges of the container locating feature in order to aid proper automatic positioning of the container T onto the shuttle. In alternate embodiments, the shuttle may not have an engagement member like member 64. In this embodiment, the shuttle 52 may have locating posts 66. Posts 66 may serve both as locating features aiding correct positioning of the container T on the shuttle 52, as well as to provide a means of positive coupling (i.e. Kinsmatic coupling) the container T to the shuttle 52. As may be realized from FIGS. 7B and 9B, the posts 66 are positioned on the shuttle 52 to cooperate with slots T22 in the container bottom T3. Posts 66, which may be formed from any suitable material, such as metal or plastic, may be anchored directly to the chassis 54 of the shuttle as shown in FIG. 8. The posts 66 may project through (suitable holes in) the cover 56 to engage the bottom of the container in slots T22 (see FIG. 9B). In this embodiment, the posts 66 may define the supporting plane for the transport container T on the shuttle. The ends or tips 66T of the posts 66 may have a generally conical or rounded shape as seen in FIGS. 7D and 8. This provides the desired three contact points between the shuttle 52 and bottom of the container for precise and repeatable definition of the support plane for the container on the shuttle. As may be realized, posts 66 support the weight of the container T, and hence have a configuration, such as radial flanges shown in FIG. 8, to distribute the container weight to the chassis. The conical tops 66T of the posts 66 may also operate as caming surfaces against the inclined sides of slots T22 in the container bottom mechanically guiding the container along the support plane until the desired position (effected by the geometry of the slots T22 and the tops 66T of posts 66) of the container on the shuttle is established.

The detection system 62 of the shuttle 52 generally comprises a number of switches 68 distributed over the area of the shuttle. The switches 68 may be located on the shuttle 52 to cooperate with the carrier sensing pads T12, the FEOL and BEOL info pads T14, T16, the carrier capacity and cassette information pads T18, T20 on the bottom of the container. FIG. 7B illustrates the positions of the pads T12-T20 on the bottom of the container T overlaid on the cover 56 and switches 68 of the shuttle 52. In this embodiment, the switches 68 are generally of the same type and similar to each other and will be described below with reference to a representative switch. In alternate embodiments, different kinds of switches may be used in different locations on the shuttle corresponding to the different types of information capable of being relayed to the given switch by the different information pads T16-T20 of the container T. The architecture of representative switch 68 is seen best in FIG. 8. In this embodiment, switch 68 may be an electro-optic switch generally comprising a base or sensor portion 68O and an actuation portion 68I. Actuation portion 68I is spring loaded as will be described further below, and is actuated by contact with a corresponding pad on the container bottom. The sensor portion 68O detects actuation of the actuation portion sending a signal to the control system. As seen in FIG. 8, sensor portion 68O may be mounted on a PCB 74 positioned on the chassis 55 of the shuttle. PCB 74 may have traces 68E formed therein for both power and signal transmission. The traces 68E may be terminated to suitable surface contacts (not shown) to which contact terminals of electronic components may be connected as desired (using any suitable means for mounting electronic components onto PCB's including flush wave soldering). The contact terminals (both power and signal) of the sensor portion 68O may be connected to the traces 68E in the PCB 74 in a similar manner. Mounting electronic components, such as the sensor portions of the switches 68 to a PCB with integral traces, serves to eliminate the individual conductors, as well as their costly and time consuming installation on the chassis, that would otherwise be used to connect the components to the power supply and control system. The traces 68E in the PCB may extend to a terminal connector (not shown) to which, for example, the connectorized end of a flexible wire harness 72 (see also FIG. 7D) may be mated. As may be realized the wire harness may link the traces 68E in the PCB 74, and hence the electronic components such as the sensor portions of the detector switches 68 to the control system 400 (see FIG. 2) and power supply (not shown). The sensor portion 68O may have for example a suitable light source such as an LED and a photo detector such as a photo cell. In the unactivated state of the switch the light source may, for example, illuminate the photo cell which causes the sensor portion to send a signal (via traces 68E) to the control system 400 that is interpreted by the control system as being the inactivated state of the switch. Upon obstruction of the light source, such as by some portion of the actuation portion 68I of the switch, the signal from the photo cell changes which in turn is read by the control system as the switch now being in the actuated state. In alternate embodiments, the sensor portion may be configured so the light source is obstructed when the switch is in the inactivated state, and illuminating the photo detector when in the activated state.

As seen in FIG. 8, the actuation portion 68I of the switch 68 is integrated into the cover 56 of the shuttle. The spring biasing the actuation portion 68I is in this embodiment formed by a portion of the cover 56. The cover 56 of the shuttle 52 may be made for example of plastic, or sheet metal or any other suitable material. In this embodiment, cover 56 may be a one-piece member (i.e. of unitary construction). In the case the cover 56 is plastic, it may be formed for example by injection molding or any other suitable process. As seen in FIGS. 7A-7D, the cover 56 in this embodiment may have a general hexahedron shape, with an upper surface 56U and perimeter walls 56W projecting from the upper surface. In alternate embodiments, the shuttle cover may have any other suitable shape. As seen best in FIG. 2, when mounted on the chassis 55, the cover 56 serves to substantially enclose the chassis within, with but a minor gap being provided between the bottom edge of the cover perimeter walls 56W and shelf 50 to facilitate free relative movement of the shuttle while minimizing entry of dust or other particulates into the shuttle systems. The top surface 56U of the cover has through holes 56H formed therein as shown in FIG. 7A. Holes 56H allow posts 66 to extend through the cover 56 as seen best in FIG. 8. Holes 56H in this embodiment also serve to position the cover 56 onto the shuttle chassis 55 as also shown in FIG. 8 (the clearance between the hole edge and corresponding post 66 is sufficiently small, so that the post 66 provides accurate positioning of the cover 56 relative to chassis 55. Further, in this embodiment the rims of the holes 56H are seated on collars 66C of the posts 66, as shown in FIG. 8, thereby supporting the cover 56 from the posts. In alternate embodiments, the cover may have any other desired mounting system for attaching the cover and chassis. As seen in FIGS. 7A-7B, the upper surface 56U of the cover has a number of resiliently flexible tabs or fingers 70 formed therein. The tabs 70 may be formed by any suitable means such as cutting the top surface 56U of the cover 56. The number of tabs 70 may coincide with the number of switches 68 of detection system 62. In this embodiment, there are eight tabs 70 formed into the upper surface of the cover. In alternate embodiments, the cover may have any other desired number of flexible tabs formed therein. In other alternate embodiments, flexible tabs may be formed in any other desired surface of the cover. In the embodiment shown in FIGS. 7A-7B, the tabs 70 are substantially similar to each other, and hence, tabs 70 may have similar resiliently flexible characteristics. In alternate embodiments, the shape (i.e. length, cross-section) of different tabs may vary to provide the different tabs with different flexibility characteristics. In this embodiment, the tips 70E of the tabs 70 are located on the cover so that when the cover is mounted to the chassis each tip 70E is positioned substantially over the sensor portion 68O of the corresponding switch 68 (see FIG. 8). In alternate embodiments, the tabs may be placed so that any other desired portion of the tab (i.e. the tab mid-section) is positioned over the sensor portion of the corresponding switch. The tab orientation on the upper surface 56U of the cover may be otherwise selected as desired to provide the tab with the flexibility of an unrestrained cantilever. The orientations of tabs 70 shown in FIGS. 7A-7B are merely exemplary, and the tabs may have any other desired orientation.

As seen best in FIG. 8, in this embodiment the actuation portion 68I of the switch 68 is mounted or located on the tip 70E of the corresponding tab 70. The actuation portion 68I may be of unitary construction with the tab 70 (formed for example during the molding process of the cover upper surface) or may be mounted to the tab 70 with suitable bonding means such as adhesive. The actuation portion 68I projects sufficiently from the upper surface 56U of the cover to come in contact with the corresponding pads T12-T20 of the container placed on posts 66, and by this contact generate sufficient deflection of the tab 70 to move the interrupter flag portion 68F of the actuation portion to (e.g. obstruct the light source and) cause activation of the switch 68 (i.e., the sensor portion 68O senses presence of and detect the actuation portion 68I insensate of the tab 70). When the container T is removed from the shuttle 52, the flexible tab 70 resiles back to the undeflected position returning the switch to the inactivated state. As may be realized, if the container T is not properly placed on the shuttle, there may be some misalignment between pads T12-T20 of the container and at least some of the actuation portions 68I of the switches 68 so that at least some of the switches do not activate. The signal combination of some switches activated and others not, may be interpreted by the control system 400 as an indication of improper placement of the container T on the shuttle. The control system programming may then prevent motion of the shuttle 52 and command corrective action to correct placement or removal of the container from the shuttle.

Figure 10:
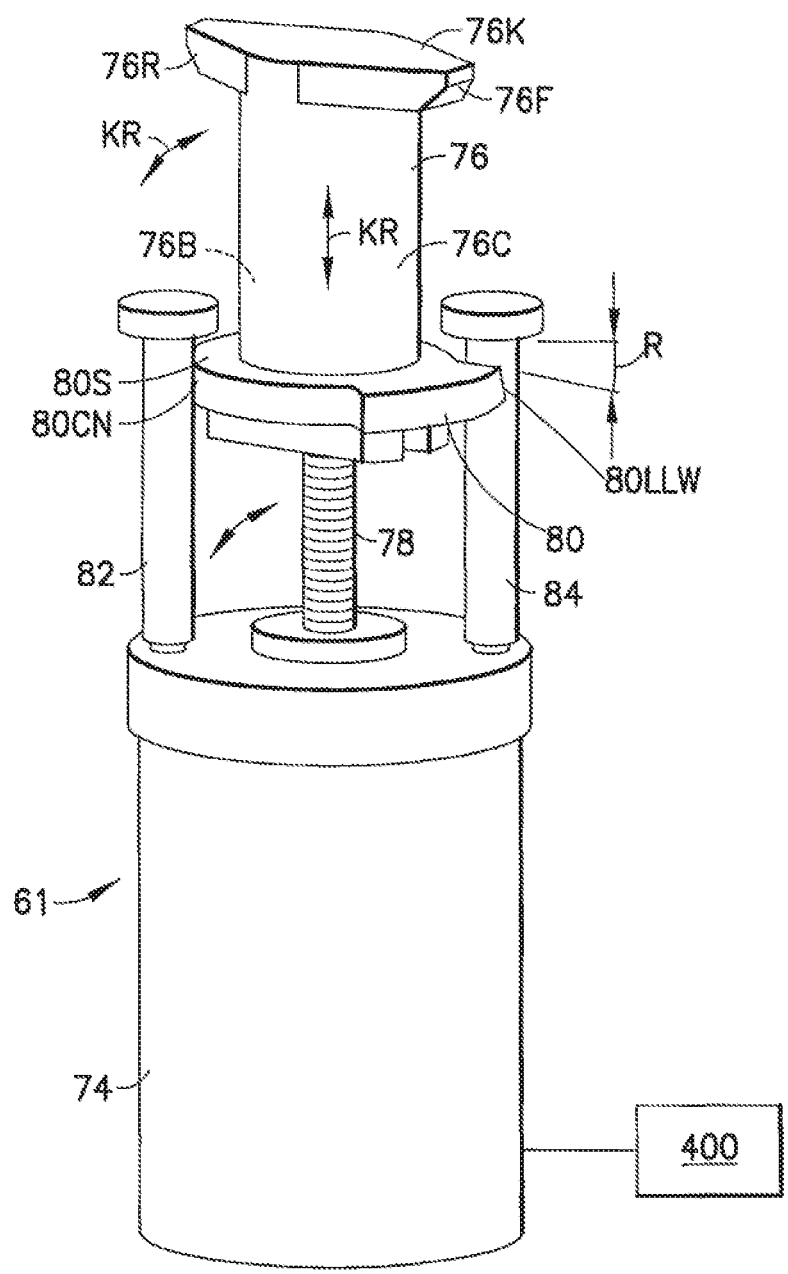
FIG. 10 is a schematic perspective view of a substrate transport container clamping system of the load port module.

As noted before, shuttle 52 may have a coupling feature 60 for positive coupling of the transport container T to the shuttle. As also noted before, posts 66 serve as kinematic coupling means between the shuttle and container during shuttle motion. In this embodiment, the shuttle coupling feature 60 may also include a container clamping system 61. FIG. 10 is a perspective view of the clamping system 61 in accordance with one exemplary embodiment. The clamping system 61 generally has a clamp key 76 that is both movable up and down and rotatable to engage the transport container through container retention feature T26 (see FIG. 9B). In the embodiment shown in FIG. 10, the clamping system 61 has a drive motor 74 that turns a lead screw 78. The clamp key 76 is mounted or otherwise connected to the lead screw 78 so that rotation of the lead screw provides the clamp key with both axial and rotational movement as will be described. The motor 74 may be any suitable type of motor such as an AC or DC motor capable of bi-directional rotation. The motor casing may be mounted to the shuttle chassis 55 as shown in FIG. 7D. The lead screw 78, which may be any suitably sized lead screw is connected to the output of the motor 74. The motor 74 is communicably connected to the controller 400 which commands both direction of motor rotation as well as the extent of rotation. The motor 74 may include an encoder or other suitable device for identifying shaft rotation and sending a suitable signal to the controller 400. As seen in FIG. 10, in this embodiment the clamp key 76 has a coupling section 76C and a key section 76K. The coupling section 76C is sized to be admitted through opening T34 in the container bottom, may have any suitable shape and has a threaded bore 76B sized to allow the clamp key 76 to be threaded onto the lead screw. The key section 76K is positioned atop the clamping section. The clamp key 76 may be of unitary construction, formed by casting or billet machining. In alternate embodiments, the coupling section and key section may be connected by any other suitable means. As seen in FIG. 10, the key section 76K has a generally elongated shape with projecting flanges 76R extending outward from the coupling section 76C forming a general T shared configuration with the coupling section 76C. The elongated shape of the key section 76K allows the key section 76K to pass through the opening T34 (see FIG. 9B) of the container retention feature only when the key section 76K is oriented so that its major dimension is aligned with the major dimension of the opening 34. This orientation will be referred to as the insertion/removal position of the key. As may be realized from FIGS. 9B and 10, rotation of the key (after insertion through opening T34 into recess T30) to an orientation where the key 76K major dimension is angled relative to the major dimension of opening T34 moves the flanges 76F to engage the engagement lips T36 of the container retention feature 26. In this embodiment, the key 76K is in the engaged position when the major dimension is substantially orthogonal to major dimensions of hole T34, and engagement between key flanges 76F and lips T86 is at a maximum.

To provide both axial movement of the key 76 (as indicated by arrow KA in FIG. 10 and used for insertion/removal of the key into the retention feature 26) and rotational movement of the key 76 (as indicated by arrow KR in FIG. 10 and used for key engagement/disengagement) with but a single drive motor, the clamping system 61 in this embodiment may have an anti-backlash nut 80 and rotation stops 82, 84. The anti-backlash nut 80 has a threaded bore so that the nut may be mounted on the lead screw 78. The nut 80 also has stop surfaces 80 CW and 80 CCW for respectively cooperating with the rotation stops 82, 84 to limit rotation of the nut at a desired rotational position. Stop surface 80 CW engages stop 82 to stop clockwise rotation of the nut, and stop surface 80 CCW engages stop 84 to stop rotation of the nut in the counter clockwise direction. The relative positions of the stops 82, 84 and stop surfaces 80 CW, 80 CCW on the nut are such as to limit the maximum rotation of the nut to about 90° (the angular difference between the key insertion/removal and engaged positions) in this embodiment. For example, in FIG. 10 the nut 80 is shown positioned with the clockwise stop surface 80 CW against clockwise stop 82. An angular gap R is thus formed between the face of the counter clockwise stop surface 80 CCW and counter clockwise stop 84. The angular gap R in this position is equivalent to the maximum angular travel of the nut, in this embodiment about 90°. In alternate embodiments, the geometry of the stops and stop surface on the nut may be established in order to set the maximum rotation of the nut to any desired amount. As seen in FIG. 10, the nut 80 and key 76 are mounted on the lead screw 78 so that the upper surface 80S of the nut 80 is seated against the bottom of key coupling portion 76C. A desired amount of compression preload between nut 80 and coupling portion 76C may be provided (by relative rotation between nut 80 and coupling portion 76C) to generate desired amount of rotating friction between nut 80 and lead screw 78 to ensure that the nut rotates substantially in unison with the screw 78 when the nut rotation is not impeded by one of the stops 82, 84. Clamping of the container to the shuttle 52 may be effected in the following manner. After receiving indication from the detection system 62 that container T is properly positioned on the shuttle 52, the controller commands operation of the motor 74 to rotate the screw 78 for example in the counterclockwise direction. At the point after placement of the container T on the shuttle 52 but before commanding movement of the motor, the key 76 is positioned with key section 76K located inside recess T30 (see FIG. 9B) of the container bottom T3 oriented in the insertion/removal position. The nut 80 is engaged by the clockwise stop 82. Counterclockwise rotation of the screw 78 rotates the nut 80 and key 76 counterclockwise until the nut 80 engages the counterclockwise stop 84 (in the embodiment about 90°). The key 76 has thus been rotated to the engaged position (flanges 76F now overhang container engagement lips T36). The controller 400 commands continued counterclockwise rotation of the screw 78 which causes the key 76 and nut 80 to be moved axially down clamping the container engagement lips T36 and hence the container to the shuttle. The controller 400 stops rotation upon receiving data from the motor encoder that the screw rotation for the desired amount of key axial movement has been achieved. To unclamp the container, the screw motion is reversed which at first causes the key 76 and nut 80 to lift off container engagement lips T36 (initial friction between key and engagement lips allowing relative rotation between key/nut and lead screw), then rotates the key 76 and nut 80 to the clockwise stop 82 (the key now disengaged) and then moves the key and nut axially up to the initial position. The container may then be removed from the shuttle.

In alternate embodiments, the single motor with an anti-backlash nut configuration of the clamping system may be replaced by a dual motor system. In that case the motors may be reversible stepper motors. One motor may be dedicated to providing axial motion of the key while the other may be dedicated to rotating the key between insertion/removal and engaged positions. The axial drive motor may be provided with a lead screw (similar to lead screw 78 in FIG. 10) on which a base nut may be rotatably mounted. Movement of the base nut during rotation of the lead screw may be limited to axial motion by linking the base nut to a linear guide rail.

The rotational drive motor may be mounted or otherwise joined by a suitable transmission to the base nut so that axial motion of the base nut results in axial motion of the rotational drive motor. The clamp key may be similar to clamp key 76 in FIG. 10 operable to clamp the transport container through the retention feature T26 (see FIG. 9B). The clamp key may be operably connected to the rotational drive motor so that the key may be rotated, by the rotation motor, between the insertion/removal and engaged position as described before. Axial motion, generated by the axial motor, may be imparted through the rotational drive to the clamp key. The stacked motor configuration may thus provide the key with both axial and rotational motion for clamping the container T to the shuttle as described before.

Referring now again to FIGS. 2 and 7A-7D, shuttle 52 may be moved (in the direction indicated by arrow M in FIG. 2) between the first or loading position and the docked position of the shuttle by drive system 54. As seen best in FIGS. 7C-7D, the shuttle drive system 54 in this embodiment generally comprises an electric motor 53 driving a lead screw 57. In alternate embodiments, the shuttle may have any suitable type of drive system such as a pneumatic or hydraulic drive system. The electric motor 53 in this embodiment may be any suitable type of motor such as an A.C. or D.C. motor, a stepper motor or servo motor. Motor 53 may be fixedly mounted to the shelf structure 50. The lead screw 57 is connected to the output shaft of the motor. The motor may be capable of rotating the lead screw both clockwise and counterclockwise. The lead screw 57 is also drivingly engaged to the chassis 55 of the shuttle. Engagement between the lead screw and chassis may be provided by any suitable means such as for example a threaded bushing fixed to the chassis and threadably engaged by the lead screw. Rotation of the lead screw 57 by motor 53 results in axial motion of the bushing over the lead screw, and hence of the chassis and shuttle 52 relative to the shelf 50 to which the motor 53 is fixed. As seen in FIG. 7C the motor 53 is communicably connected to the controller 400 by a suitable circuit 91. The controller 400 may provide both command signals and power (from a suitable power supply) to motor 53 over circuit 91. The motor 54 may include a motor encoder 58E (see FIG. 7D) for sending position indication data to the controller. The controller 400 may be capable of processing the motor encoder data to identify the position of the shuttle on the load port. In alternate embodiments, a linear encoder may be mounted between the shuttle and support shelf to identify the shuttle position during movement. As seen in FIG. 7C, in this embodiment circuit 91 may also include a pinch protection circuit 90 capable of detecting an obstruction to shuttle motion. The pinch protection circuit may include a current sensor 92, of any suitable type, and of desired sensitivity capable of measuring current changes to motor 53. The current sensor 92 is configured as desired to monitor the current supplied to motor 53 through circuit 91. Measurement signals from the sensor 92 are transmitted by circuit 90 to the controller 400. The pinch protection circuit 90 may be a closed loop or open loop system as desired. As may be realized, when the shuttle is being advanced by the drive motor 53 and encounters an obstruction, the current supplied the motor (via circuit 91) increases in general proportion to the level of resistance to shuttle motion provided by the obstruction. The "excess" current is detected by sensor 92 and the information is relayed to the controller 400 via circuit 90. The sensor 92 may be capable of sending raw or unprocessed sensor data to the controller 400. The controller may be programmed (such as a suitable algorithm) to process the data from the sensor to identify, from noise, when excess current, of sufficient level and of sufficient duration to indicate an obstruction, is being supplied to the motor 53. Controller 400 has an auto-reverse program 402 (see FIG. 1) wherein upon identification of the excess current (and hence of the obstruction to shuttle motion) the controller sends a command signal to motor 53 stopping the previously commanded operation and reversing the motor direction. The rotation of the lead screw 57 effecting movement of the shuttle 52 is thus also reversed thereby causing the movement of the shuttle to be reversed away from the obstruction. The shuttle may be reversed a predetermined distance established from encoder 53E information. In alternate embodiments, the current sensor 92 may be programmable to select desired set points for detecting the excess current. In this case, the current sensor may send a suitable signal to the control upon detection of an excess current having a level and duration exceeding the programmed set points. Upon receiving the signal from the current sensor, the controller accesses the auto-reverse program 402 in the controller memory. This provides superior obstruction detection and recovery system at a lower cost than conventional systems that employ a deflectable (i.e. pinch) bar.

Referring now again to FIG. 2, the load port module in the embodiment shown may have transport container advance detection system 110 (depicted schematically in FIG. 2). The container advance detection system 110 is a non contact system to detect a feature of a container T mounted to and being advanced by the shuttle 52 and effect stopping the shuttle so that when the container is in the docked position the front face of the container is in a desired repeatable location regardless of the tolerance variations between different containers. It is desirable to stop the load port shuttle advance motion so that there is a minimum clearance between the container and the load port frame 29 without actual contact between them. Since container dimensions will vary, especially between manufactures, in conventional systems the shuttle movement is generally adjusted for "worst case", allowing an overly large clearance in most instances. The container advance detection system 110 of the load port module 24 overcomes the problems of conventional systems allowing different containers to be stopped with the front face at location L1 providing minimum clearance. The detection system 110 in this embodiment has a "thru beam" sensor configuration with an emitter or source of radiating energy and a detector for detecting the radiating energy from the emitter. For example, in this embodiment the detection system 110 may have a light source 112, such as a LED or laser diode on the terminal end of an optical fiber connected to a suitable remote light source. The system 110 may also have a suitable light sensing portion 114 such as a photo cell for sensing the light beam from the source 112. As seen in FIG. 2 the light source 112 and sensor 114 are positioned on opposite sides of the shuttle 52 and at a desired height so that the container T mounted and transported by the shuttle 52 will break the light beam B emitted by the source 112 and illuminating at least the sensing part of sensor 114. Though not shown in FIG. 10, the light source 112 and sensor 114 may be housed in suitable covers for contact and particulate protection and to prevent inadvertent interruption of the beam by objects other than the container transported by shuttle 52. As seen in FIG. 2, the sensors 112, 114 are positioned at an offset distance in the direction of shuttle travel (indicated by arrow M in FIG. 2) so that the light beam B is spaced a desired distance d from the location L1 of the front face of the container T when brought to the docked position by the shuttle. As may be realized, the front face of the container T advanced by the shuttle, breaks the beam B when at distance d from the docked position location L1. The controller 400 is programmed with distance d. The controller 400 is also programmed with an algorithm (program module 401 in FIG. 1) that uses shuttle movement information, such as may be provided to the controller by motor encoder 53E (see also FIG. 7D), and the distance d to determine when shuttle advance movement is to be stopped so that the front face of the container T on the shuttle is at location L1. Hence, when the front face of the advancing container T breaks beam B, the sensor 114 sends a suitable signal to the controller 400 informing the controller of the detection of the container front face. The controller 400 then may determine when to command the shuttle advance to stop as noted above, and sends the command to the shuttle drive section 54 at the correct time. In this manner, each container T transported by the shuttle is appropriately positioned in its docked location to have the container front face at location L1 regardless of the dimensional variation between containers.

With the container T in the docked position, as shown in FIG. 1, the door T4 of the container may be engaged by the door 30D of the load port module access port 300. The door T4 in the front face of the container T is schematically illustrated in FIG. 9A. The door T4 may include latch systems T40, T42 that when engaged retain the door T4 in the container box. Examples of the latch systems for the container door are disclosed in U.S. Pat. No. 5,772,386, issued Jun. 30, 1998 and incorporated by reference herein in its entirety. The door latch systems T40, T42 may include a pivotable hub T44, to which the latch tabs T46 may be articulately linked. Rotation of the hub T44 causes actuation of the latch tabs T46 to engage and disengage the container housing. The latch hub T44 is accessible through latch key access holes T50 in the door T4. The container door T4 may also have locator pin holes T52 as shown in FIG. 9A. Referring again to FIG. 2, the access port door 30D of the load port module has locator pins 120 and latch keys 122 in a complementary or matching configuration to the locator pin holes T52 and latch key access holes T50 in the door T4 of the container. The locator pins 120 and latch keys 122 in port door 30D may be similar to locator pins and latch keys in U.S. Pat. No. 5,772,386 (previously incorporated by referenced herein). The latch keys 122 of the port door 30D conform to the shape of the key access holes T50 in the container door and key hole in the hub T44 of the latching system. When the port door 30D engages the container door T4, the latch keys 122 on the access door 30D enter through key access holes T50 into the key holes formed in the latch hues T44 of the container. Rotation of the latch keys 122 causes rotation of the hubs T44 and actuation of the latch systems to engage/disengage the latch tabs thereby locking or unlocking the container door T4 from the container.

As may be realized, latch keys 122 are rotatably mounted in the access door structure. The latch keys 122 may include spindle shafts that are pivotally held in the access door. The far ends of the spindle shafts 122S are shown in FIG. 4. FIG. 4 also shows the drive system 124 for operating the latch keys. As seen from FIG. 4, the latch keys 122 are independently driven. In this embodiment, the latch key drive system 124 includes two servo motors 126A, 126B, one for actuating each corresponding latch key. Servo motor 126A is linked by a suitable transmission 128A to the spindle shaft 122S of one latch key, and servo motor 126B is linked by a different transmission 128B to the spindle shaft of the other latch key. As seen in FIG. 4, both the servo motors 126A, 126B and the corresponding transmissions 128A, 128B linking the motors to the respective key spindle shafts are independent. Thus each key 122 may be independently actuated. The servo motors 126A, 126B may be communicably connected to the controller 400 to receive operating commands ordering motions of the servos, and to send suitable signals to the controller identifying the motion accomplished by the servos in response to movement commands. If desired, the controller may synchronize actuation of the latch keys 122 to move through substantially the same range of motion at substantially the same time. Otherwise, the controller 400 may allow each key to rotate at its optimum speed and await signals from the servo motors that the commanded motion is completed. In either case, the independent drive motors 126A, 126B independently driving each of the latch keys 122 provide about twice the acuity to latching/unlatching problems (such as may be caused by misalignment between port door and container door, or between container door and container box, or damage to the container box) compared to conventional systems having a common drive for both latch keys. Unlocking of the container door latch systems T40, T42 (by activation of latch keys 122 of the port door as described above) releases the container door T4 from the container box. Upon release, the latch keys 122 engaged into the container door serve to support the container door T4 from the front door 30D.

Figure 6:
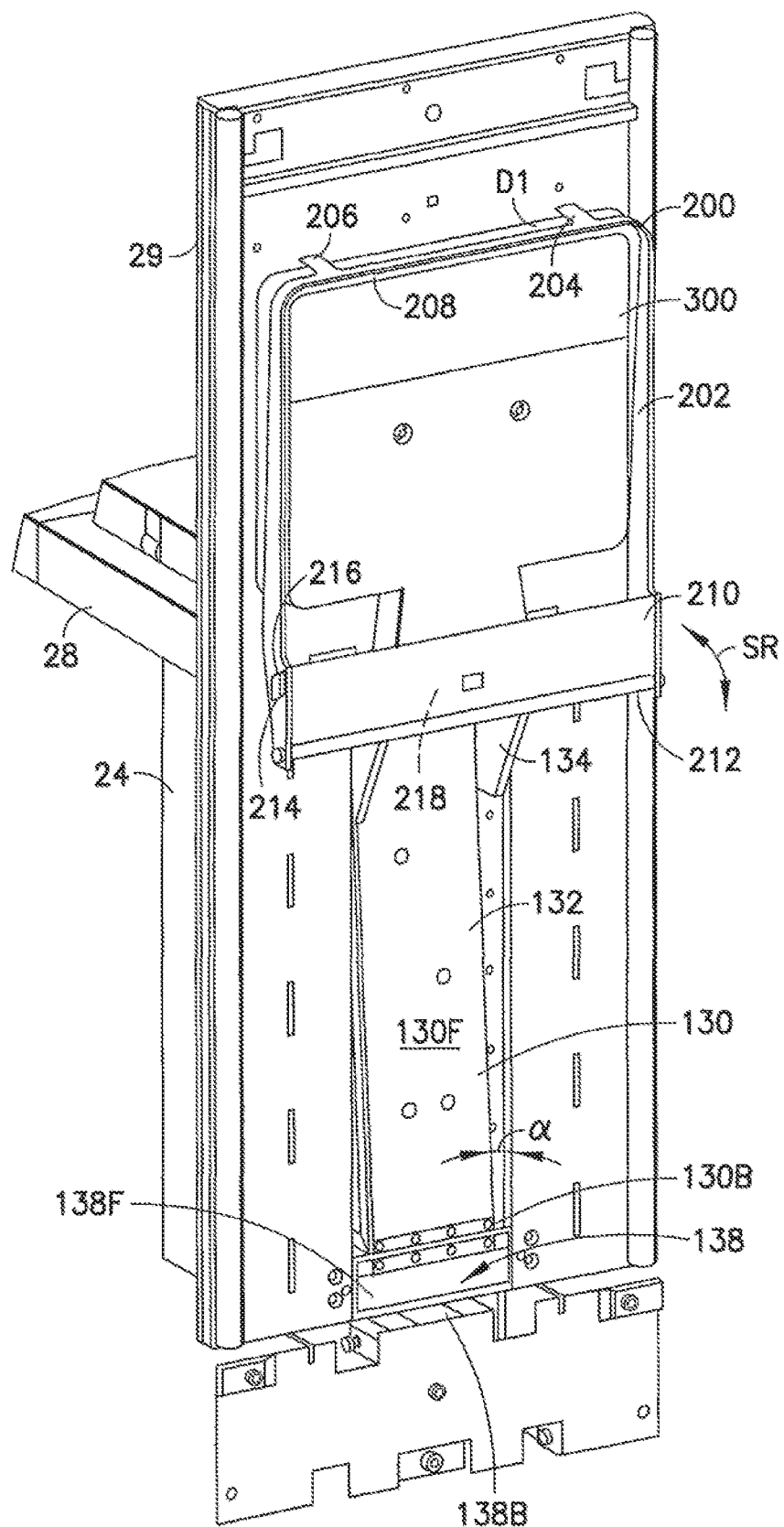
FIGS. 6-6A respectively are yet another perspective view showing the rear of the load port module, and a side elevation of the load port module.
Figure 6A:
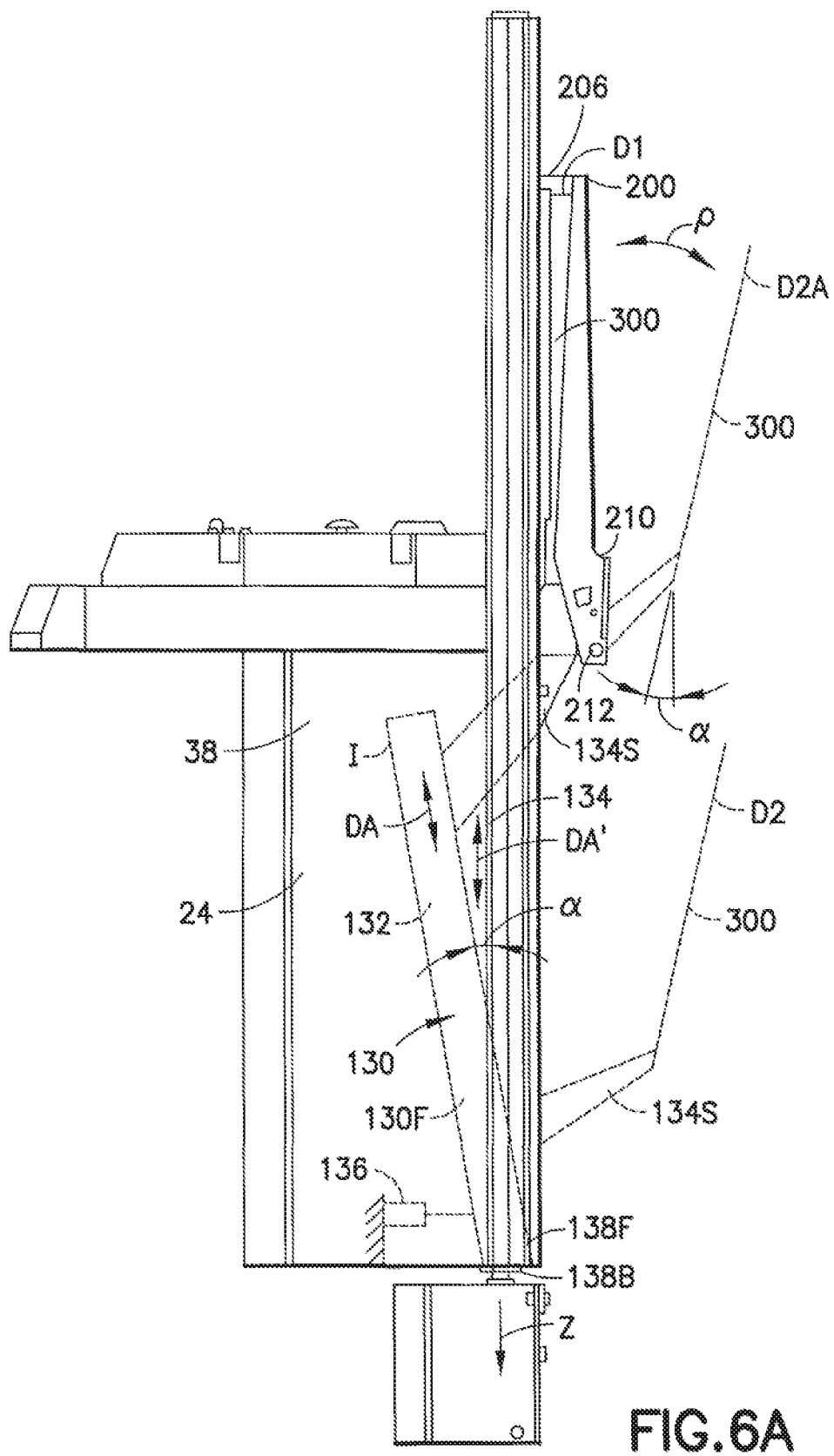

FIGS. 6-6A respectively show another rear perspective view and side elevation view of the load port module 24. As noted before, the port door 30D is movably mounted to the load port module frame 29. As will be described in greater detail below, the port door 30D may be moved relative to the frame 29 sufficiently to provide sufficient access through access port 300 (see also FIG. 2) to facilitate substrate transport through the access port. In FIG. 6, the port door 30D is shown in, what shall be referred to for convenience, a closed or initial position D1. In this embodiment, when placed in its initial position, the door 30D may contact the frame edges or rim of the access port 30D to substantially seal the access port in its entirety. In alternate embodiments, the door in the closed position may not contact the frame or form a seal around the access port. In other alternate embodiments, the door in the closed position may only partially obstruct the access port, and may be offset a distance from the frame edges around the access port. The load port module 24 has a door transport system 130 capable of moving the port door 30D from the closed position D1 to an open position D2 shown substantially in FIG. 6A. If desired, the port door 30D may be moved from its closed position after engagement to the container door T4 and release of the container door from the container box. As described before, after release from the container box, the container door T4 is supported by, and hence moves in unison with, the port door 30D. The door transport system 130 in this embodiment may be an electro-mechanical drive system, though in alternate embodiments any suitable drive system, such as pneumatic or hydraulic, may be used. The transport system 130 is shown schematically in FIGS. 6-6A. Transport system 130 may generally include a frame 130F on which a suitable drive motor (not shown), such as a stepper motor is mounted. The frame 130F also movably supports a carriage 134 on which the port door 30D is fixedly mounted. A suitable linear drive transmission 132 drivingly connects the drive motor, in the frame, to the door carriage so that operation of the motor causes the carriage to move relative to frame 130F along the transport system drive axis (indicated by arrow DA in FIG. 6A). Though movable along drive axis DA, the carriage is otherwise fixed relative to frame 130. The linear drive transmission 132 for example may comprise a lead screw, driven by the output shaft of the drive motor, and engaged to a nut on the door carriage 134. As seen in FIG. 6, the frame 130F of the transport system 130 is mounted by a movable mount 138 to the frame 29 of the load port module. The movable mount 138, which will be described in greater detail below, allows the transport system frame 130F to pivot (about a pivot axis of mount 138) relative to the load port module frame (as indicated by arrow P in FIG. 6A). When the frame 130F is pivoted, the transport system along with the carriage 134 and door 30D are also pivoted about the pivot axis of mount 188.

FIG. 6A shows best the position of the transport system 130 when the port door 30D is in the closed position D1. FIG. 6A also shows best the relative tilt between the port door 30D and the drive axis DA of the transport system in this embodiment. The port door 30D fixed on carriage 134 has an orientation that defines an angle α with the drive axis DA of the transport system 130. When the door 30D is in the closed position, the front face of the door may be substantially aligned with the vertical axis Z (i.e. the rear face of the access port) of the load port frame reference system. Alignment of the port door in the closed position with the vertical axis Z ensures proper engagement with the container door T4 when the container is in the docked position as noted before. In this position, as seen in FIG. 6A, the transport frame 130F is inclined forwards so that the drive axis DA forms an angle α with the Z axis. To open the port door 30D, in this embodiment, the transport system frame may be rotated, in the direction indicated by arrow P, to a position where the drive axis is vertical (in this position the drive axis is identified as DA'), and the carriage 134 is then moved along the drive axis DA' to position D2. Closing the door is accomplished in a substantially similar but reverse manner to opening. As seen in FIG. 6A, a suitable actuator 136, such as an electric solenoid or pneumatic piston may be used to pivot the frame. As noted before, in this embodiment door 30D has a fixed orientation relative to the door carriage 134, and the carriage 134, though translatable relative to the transport frame 130F along axis DA', maintain a fixed orientation relative to the drive axis throughout the full range of motion of the carriage on the transport system. Hence, the orientation of the door 30D remains fixed relative to the transport drive axis DA'. Further, rotation of the transport frame 130F pivot 138 causes commensurate rotation of the door 30D about the pivot. For example, rotation of the frame 130F through angle α from the closed position (thereby positioning the transport system drive axis to the vertical position indicated by arrow DA' in FIG. 6A) will move the door 30D sufficiently so that the container door T4 (see FIG. 9A), if supported on the port door 30D, is moved through the access port 300 (see also FIG. 1) into the front section 12. The position of the port door 30D after pivot but before translation is schematically depicted in FIG. 6A by line D2A. In this position, the port door 30D is angled relative to the vertical axis Z at angle α. In this embodiment, the port door 30D may be translated down by the carriage 134 along the drive axis (indicated by arrow DA') to position D2 after the drive axis is moved to the vertical position.

Still referring to FIGS. 6-6A, in this embodiment the door transport system 130 is housed substantially inside the front extension section 38 of the loadport module 24, both when the track 130F is in the inclined position (indicated by position I in FIG. 6A) and when the track is rotated to its vertical position. Portions of the carriage supports 134S, to which port door 30D is mounted, may project beyond the plane of the access port 300 (as defined by base plate 292, see FIGS. 3-4) only as sufficient to allow connection between the door and carriage supports. In the embodiment shown in FIGS. 6-6A, the connection between door and carriage supports is such that the projection portions of the carriage supports 134S, project from the plane of the access port about the same distance as the thickness of the door. As may be realized from FIGS. 6-6A, placement of the door transport systems 130 inside the front extension section 38 of load port module (i.e. in front of the plane of the access port) commensurately eliminates the demand for space to accommodate the transport systems with the front end module 12 as in conventional systems. Accordingly, the space envelope for the end module 12 may be reduced compared to conventional system. Moreover, as the extension section 38 housing the door transport system, is located within the footprint of the transport container holding station 34, the overall footprint of the load port module 24 in this embodiment is generally comparable to conventional load port modules. Hence, the overall footprint of the front end module 12 and load port module 34 is less than conventional systems.

Figure 11:
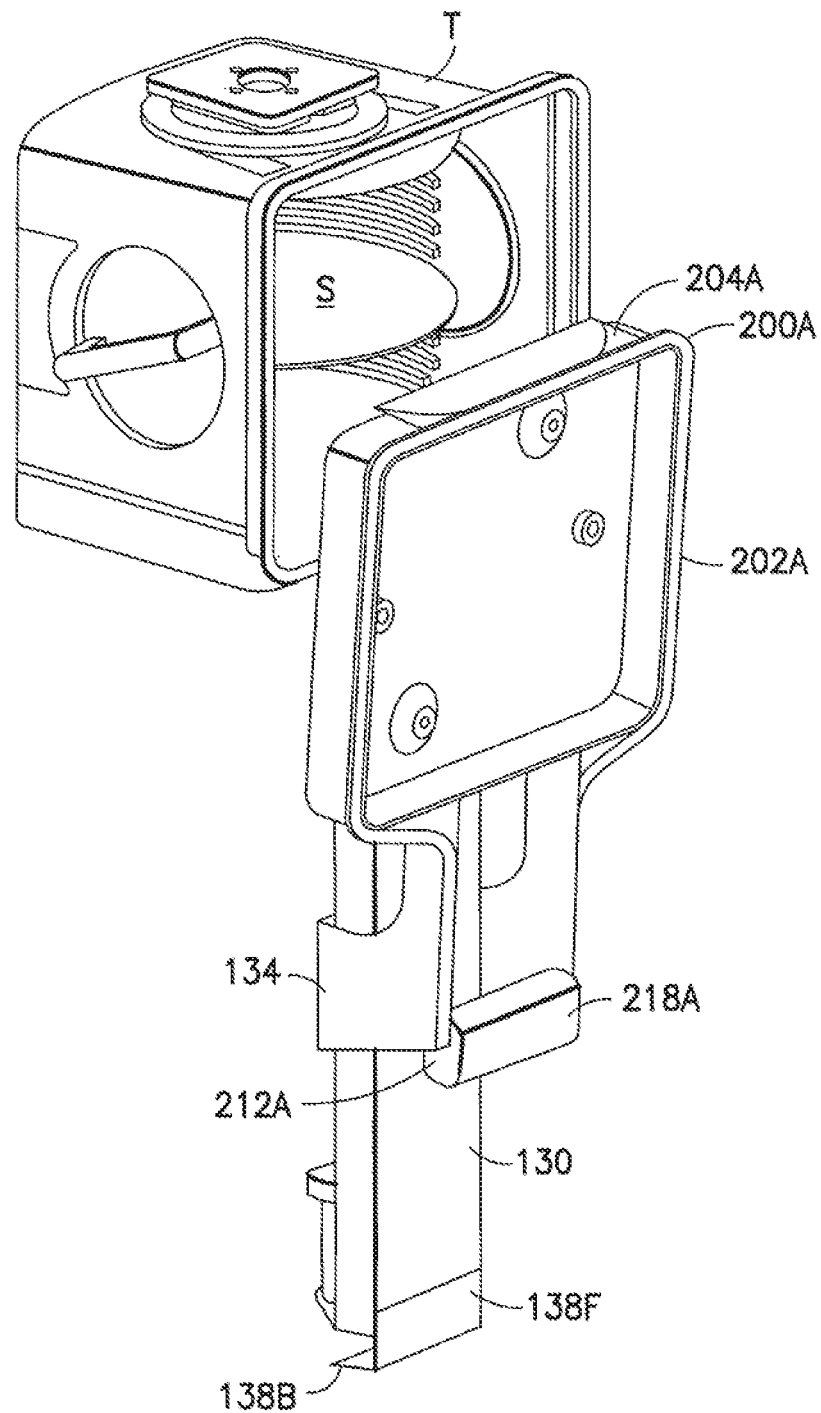
FIG. 11 is yet another partial perspective view illustrating a section of the load port module, and a substrate transport container T in a docked position on the load port module (portions of the load port module are omitted for clarity), with a movable portion of the load port module located in a first position.

Movable mount 138 that mounts the door transport system 130 to the load port frame 29 is shown in FIGS. 6-6A, and also in FIG. 11. The mount 138 as noted before is configured to allow sufficient pivoting movement of the door transport system (in direction indicated by arrow P shown in FIG. 6A) so that the door 30D may be moved between its closed and open positions. In this embodiment, the movable mount generally comprises a base section 138B and a resiliently flexible section 138F connected to the base section. The transport system frame is attached and supported from the resiliently flexible section 138F of the flexible mount 138, and the flexibility of the resiliently flexible section enables the movement of the transport system and door 30D relative to the load port module frame. In the embodiment shown in FIGS. 6-6A, the movable mount 138 is representatively illustrated as having a general L shape or structural angle configuration with the base section 138B at the bottom of the mount and the flexible section 138F extending generally upwards from the base section. The mount 138 may be of unitary construction and may be made of any suitable material such as metal, plastic or composite. The base section 138B illustrated in this embodiment as a flat frame may have any suitable shape with sufficient mounting surfaces, such as flanges, for mounting the mount to the load port frame. The base section 138B is highly rigid relative to the flexible section 138F so that substantially all motion of the mount 138 for movement of the transport system, as described above, is derived from resilient flexure of the flexible section. In this embodiment, the flexible section 138F has a general leaf or semi-leaf spring shape cantilevered from the base section. In alternate embodiments, the flexible section may comprise any suitable resiliently flexible elements such as torsion springs, or viscoelastic portions capable of generating the desired motion of the transport system to move the door 30D between closed and open positions. In the embodiment shown in FIGS. 6-6A, and 11, the flexible section 138F of movable mount 138 is depicted as being a single leaf spring member for example purposes, and the flexible section may include any desired number of leaf spring members positioned alongside each other in a single plane, or arrayed serially in multiple substantially parallel planes, to deflect in unison and generate the desired movement of the transport system. In this embodiment, the flexible section 138F is attached (by any suitable means such as mechanical fasteners, metallurgical or chemical adhesive bonding the leaf spring section to the transport system frame 130F proximate the bottom 130B (see FIG. 6) of the transport system frame. In alternate embodiments, the transport system movable mount may be located at any desired location along the length of the transport system. As may be realized, the flexible section 138F is oriented so that the leaf spring is in an undeflected configuration when the door is in its closed position (D1 shown in FIG. 6A). Operation of actuator 136 to displace the transport system 130 and open door 30D, causes the deflection of the resiliently flexible section 138F of the mount 133 (such as by resilient bending of the leaf spring in the direction indicated by arrow P) allowing the door to be rotated through angle α and reaches the open position D2A. Operation of the actuator 136 to close the door 30D, causes the flexible section 138F to return to its undeflected position. The flexible section 138F is sized to sustain a substantially infinite number of door motion cycles. The movable mount 138, movably supporting the port door 30D in the exemplary embodiment relies on flexibility to facilitate motion, and hence, has no clearance gaps (as would be provided on conventional movable mounts to enable relative sliding movement between movable parts). This ensures that the motion of the door 30D between closed and open positions occurs substantially along the same path and hence the door returns to substantially the same closed position each and every time to a degree of accuracy simply not possible using conventional movable mounts. This accuracy in the position of the door 30D, eases its interface with the door T4 (see FIG. 9A) on the transport container T as well as the fit up between the container door and box upon closure of the container. The movable mount 138 is also significantly easier to fabricate and install compared to conventional movable mounts employing sliding (rotational or linear) between mount elements.

The load port module 24 has a sensor 200 capable of detecting a presence of substrates within container T when container door T4 is removed. In the embodiment shown in FIGS. 6-6A, the sensor 200 is mounted on the carriage 134 of the transport system 130, as will be described below, and thus moves with the carriage 134. The sensors 200 may be of any suitable kind, such as a thru-beam sensor, (e.g. an electro-magnetic beam source and detector), a CCD or capacitive influence sensor. In the embodiment shown in FIG. 6, the sensor 200 is depicted for example purposes only as a thru-beam sensor with two sensor heads 204, 206 (respectively the beam source and detector). In this embodiment the sensor 200 is located above the door 30D. In this embodiment, the sensor 200 is mounted on frame 202. As seen best in FIG. 6 extends generally around the door 30D to mount the sensor on the carriage 134. Frame 202, in this embodiment, has a general hoop configuration generally surrounding, but not in contact with door 30D. Hoop frame 202 has a generally transverse member 208, located above the door 30D, providing the support surface for the sensor heads of sensor 200. The sensor frame 202 also has a base portion 210, movably mounted to the door carriage 134. The movable mounting between the frame 200 and carriage 134 allows movement of the frame, or at least a portion thereof, between a stowed or battery position wherein the sensor 200 is located within the EFEM as shown in FIG. 6A, and a deployed position wherein the sensor 200 is positioned through the access port 30D into the transport container T as will be described below. In the exemplary embodiment shown in FIGS. 6-6A, a pivot joint or hinge 212 connects the frame 202 to the carriage 134. The hinge 212 allows rotation of the frame in the direction indicated by arrow SR (see FIG. 6). In alternate embodiments, any other suitable type of movable mount allowing any desired relative motion (i.e. linear or rotational) between sensor frame and carriage, for example slides (e.g. linear or rotational) or resiliently flexible mounts, may be used. In still other alternate embodiments, the sensor frame may be fixedly mounted to the carriage, and include intermediate movable joints between carriage mounting and sensor platform allowing the sensor platform to move relative to the carriage in order to deploy the sensor into the transport container.

As seen in FIG. 6, a drive 218 is operably connected to the frame in order to effect movement of the frame about hinge 212 in the direction indicated by arrow SR. The sensor drive 218 may be of any suitable type, such as a servo motor or stepper motor or a pneumatic drive. Biasing means, such as springs (not shown) may be provided allowing automatic return of the sensor frame to the battery position in the event of power loss to drive 218. In addition, positive stops 216 interacting with snubbing surfaces (for example apertures 214 in the frame 202) to stop undesired movements of the frame, such as may arise from uncommanded drive inputs from drive 218. Drive 218, as will be described further below, facilitates independent movement of the sensor 200 (in the direction indicated by arrow SR in FIG. 6) relative to the port door 30D. As noted before, the sensor 200 is shown in the battery position in FIGS. 6-6A. In this embodiment, the sensor frame 202 is configured so that when the sensor is at battery, the frame 202 and sensors 204, 206 do not protrude substantially inward into the EFEM beyond the innermost edge of the door 30D. Accordingly, the space envelope, from the front face 12F (see FIG. 1) into the EFEM, to accommodate the sensor and frame 202 is substantially the same as for the port door 30D. In alternate embodiments, the sensor frame may have any other desired profile.

Figure 12:
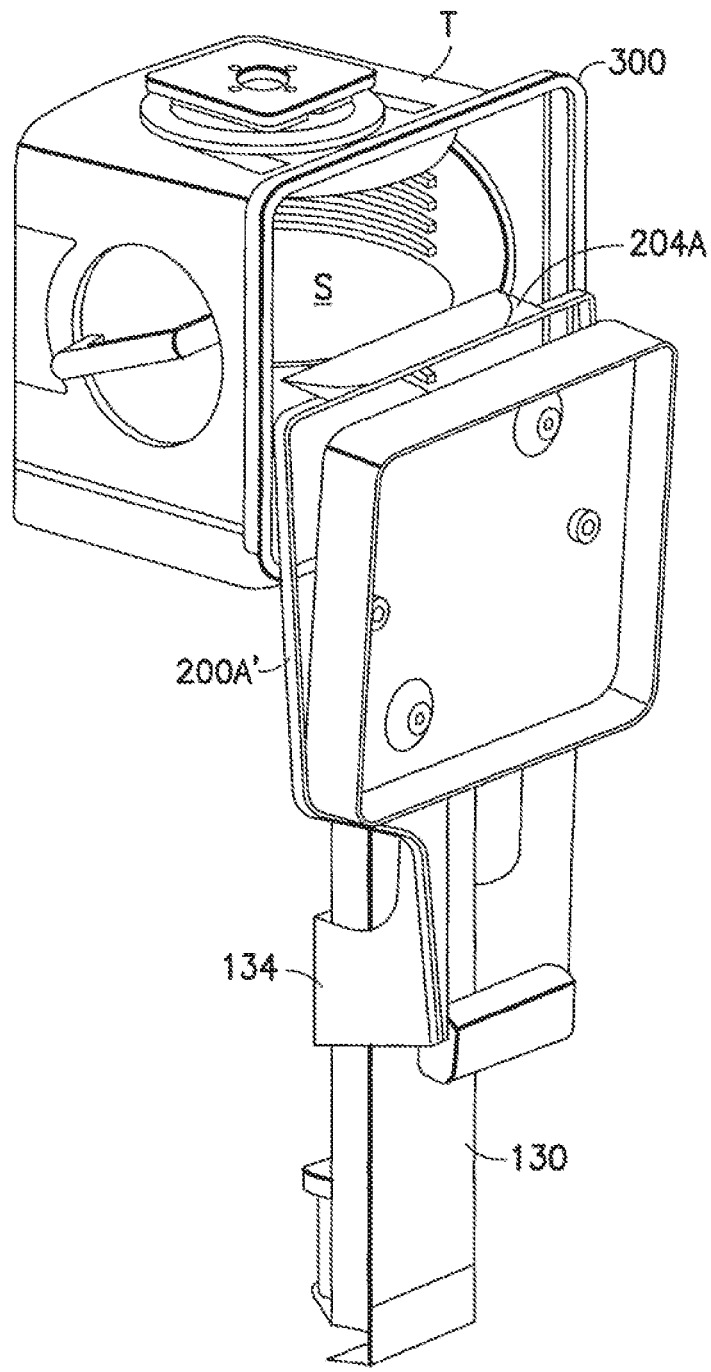
FIG. 12 is still yet another partial perspective view of the load port module and substrate transport container similar to the view in FIG. 11, but showing the movable portion in another position.

FIGS. 11-12 illustrate a sensor 200A in accordance with another exemplary embodiment. The sensor 200A shown in FIGS. 11-12 is substantially similar to sensor 200 described above and shown in FIGS. 6-6A, and similar features are similarly numbered. Frame 202A, is generally similar to frame 202, providing a sensor support for sensor head 204A above the door, though in alternate embodiments the sensor head may be positioned at any desired location relative to the door or on the frame. Pivot mount 212A mounts the frame 202A to the carriage, and motor 218A operates on the frame to rotate the frame (in the direction similar to direction SR in FIG. 6) and thereby move the sensor retention battery and deployed positions. The sensor battery and deployed positions in the embodiment are substantially the same as the battery and deployed positions of the sensor 200 in FIGS. 6-6A. Accordingly, FIGS. 11-12, along with FIGS. 6-6A will be used to describe the motion of the sensors, such as for example when mapping the substrates in the container T. As noted before, the sensor is shown in the battery position when port door 30D is in the closed position (see FIG. 6A). Rotation of the transport system frame 130F (as also described before) opens the door (see position D2A in FIG. 6A) and moves the drive axis DA to vertical. As may be realized, the sensor frame 202A, independently (with respect to door 30D) mounted to carriage 134 of the transport system is also rotated inwards by rotation of the transport frame. The sensor 200 is still at battery relative to its range of motion. Prior to deployment of the sensor, carriage 134 may be moved down along drive axis DA to a position placing sensor 200, 200A below the edge of the port opening 30D (see also FIG. 12). This allows, in the embodiment shown, unencumbered movement of the sensor from battery to deployed position. FIG. 12 best illustrates the sensor in the deployed 200A'. Movement of the sensor 200, 200A to the deployed is accomplished in this embodiment by independently rotating the frame 202, 202A in the direction indicated by arrow SR in FIG. 6. As seen in FIG. 12, in the deployed position the sensor head 204A protrudes through port opening 300 into the container housing sufficiently to detect the presence of substrates S inside the container T. Mapping of substrate locations in the container may be performed by moving the carriage 134, 134A down along drive axis DA' (see FIG. 6A) when the sensor 200, 200A is in the deployed position 200A'. As may be realized, mapping of the container T may be performed concurrent with the transport of the port door 30D from position D2A to position D2 (see FIG. 6A). Sensor signals may be transmitted via a suitable communication link (not shown) to controller 400 (See FIG. 1).

As noted before, and with reference now again to FIG. 2, the load port module 24 is an intelligent load port module. Load port module 24 includes an integral user interface 100, allowing a user to input data, programming instruction and commands and receive desired information from the system. In this exemplary embodiment, the user interface 100 includes a display 300. As seen in FIG. 2, display 300 is mounted to the load port frame 29. In this embodiment, display 300 is located to be visible through opening 2912 in frame 29. Display opening 2912 in frame 29 is located above the port opening 300 to allow a user an unobstructed view of the display when transport containers T are positioned at the support station 36. In alternate embodiments, the user interface display 300 may be located in any other desired position on the load port. Display 300 in this embodiment is a graphical display (such as for example a LCD with any desired definition) capable of displaying any desired graphical information 302. This display structure is configured to allow reading of display information when viewing the display from any position in an arc or about 130° in front of the display. The display 300 may be color or monochrome, and may also include a touch screen 304, which in combination with selectable features displayed on display 300 allow a user to select desired commands and input desired data and information. Other user interface devices such as keypads 306 (see FIG. 1) or cursor tracking devices (e.g. mouse, joystick) may also be included in the load port module user interface 100 to operate in conjunction with or separate from the display 302. As seen in FIG. 2, the user interface 100 input devices (i.e. touch screen 304, keypad 306) and output devices (display 300) are connected by any suitable bi-directional communication links 500 to controller 400. The communication link may be wired, between LPM 24 and controller 400 for example, using FireWire™ communication protocol, or may be wireless for example using Bluetooth™ communication protocol. The communication link 500 may be incorporated into a network (for example a local area network, or a global network such as the internet) or may be a dedicated direct link between LPM user interface 100 and controller 400. In FIG. 2, the communication link between controller 400 and LPM systems such as the user interface 100, the shuttle drive 54, detection system 62, is illustrated as a representative communication link. The communication link however may be arranged as desired over any suitable number of communication pathways. For example, the communication link between controller 400 and user interface 100 may be disposed over one pathway, and the communication link interfacing the controller 400 with the shuttle drive 54 and/or detection system 62, and/or any other controller operated systems of the LPM described above may be disposed over a different communication pathway. It is noted, that the user interface 100 mounted in a given LPM 24 may not be limited to serving as the user interface for that LPM only. In the embodiment shown, the user interface 100 in a given LPM frame may serve any desired number of LPMs. The LPMs capable of being served by the user interface 100 may be mated to the same EFEM 12 (see FIG. 1), or may be mated to a number of different EFEMs (not shown). In the embodiment shown in FIG. 1, controller 400 is communicably connected to the two LPMs 24 of the exemplary tool 10. The communication link 500 between controller 400 and controllably operable systems of each LPM (e.g. shuttle drive 54, container detection system 62, container advance detection system 110, latch key drive system 124 (see FIG. 4), door transport system 130 (see FIG. 6), mapper sensor 200, substrate transport apparatus 40, aligner 42 (see FIG. 5) etc. . . . ) and between the controller 400 and user interface 100 of a given LPM 24, in effect defines a communication link between the user interface of each LPM and systems of either LPM. Controller 400 may be further coupled to other LPMs of other processing tools (not shown), and communication between the user interface 100 and systems on the other LPMs may be effected in a similar manner. In the embodiment shown in FIGS. 1-2, each LPM 24 coupled to an EFEM 12 has an integral user interface 100, though as noted before, in alternate embodiments one or more of the LPMs may be without an integrated user interface, and sharing the integral user interface of another LPM. As seen in FIGS. 1-2, communication link 500 further connects the controller, and hence, the user interface 100 to other components and systems of the tool 10 such as the loadlock 14L and processing section 14 modules transport apparatus not shown) and atmosphere control system (not shown). Thus, the user interface 100 of the LPM 24 in this embodiment may be used to access information from, monitor and control any desired systems of a given tool that are in communication with the controller. In alternate embodiments, the user interface integral to an LPM may be used to interface with any desirable system of any tool that is in communication with the controller linked to the interface. As seen in FIG. 2, in this embodiment communication link 500 may include some pathways or channels 500A, 500B that bypass the controller 400 and directly link the user interface 100 to one or more systems of the LPM 24 into which the user interface is integrated, and/or one or more systems of the EFEM 12 to which the LPM is mounted, and/or one or more systems of the tool 10. For example, communication pathway 500A may directly link user interface 100 to the container shuttle drive 54 and detection system 62, and pathway 500B may link the user interface directly to the container advance detection system 110. Other pathways (not shown) similar to pathways 500A, 500B may directly link the user interface to the other integral systems of the LPM 24 (e.g. latch key drive 124, door transport 130, mapper 200, substrate transport apparatus 40, aligner 42 etc.). In this embodiment, the user interface 100 may also include a local processor 310, coupled to display 300, touch screen 304 (and if desired keypad 306). The local processor 310 may have adequate processing capability (though if desired less than controller 400) to receive and process for display, on display 300, raw signals from the various systems in direct communication with the user interface 100, and also format and transmit suitable commands (from user interface input) to the various systems bypassing the controller 400. For example, the local processor 310 may provide, independent of controller 400, a "soft" key for starting/stopping operation of a desired system, such as the container shuttle drive 54, or door transport 130. The local processor may display the "soft" key 308C on the display 300, and also may change the displayed states of the key upon selection by the user. For instance, if the soft key 308C is displayed initially as "START", upon user selection of the key the processor 306 may change the display to read "STOP" (and conversely change to "START" upon selection of "STOP"). The local processor 310 may also register the selection by the operator and generate therefrom a suitable command that is transmitted to the desired system. The local processor may also change the displayed state (e.g. intermittent display "STOP") upon receiving a signal from the system that the command cannot be performed due to the system encountering operational limits (e.g. travel stops for the shuttle transport) or a system fault (e.g. damaged drive or motive system). As may be realized, the local processor 310 may be able to display any other desired information. Interface between the local processor 310 and display 302, touch screen 304 as well as between local processor 310 and the systems the user interface 100 may directly communicate with, may be accomplished in cooperation with the controller 400. The controller 400 may have software interlocks (not shown) that enable the display and/or selection of various features and information capable of being brought up by local processor 310 on the display 300/touch screen 304. For example, controller 400 may enable "soft" key 308C for display/selection availability by the local processor 310 when the LPM 24 or tool 10 is not operating within a production cycle. The local processor 310, which may have limited processing capacity and memory compared to controller 400, may download a desired command subroutine or algorithm from the controller 400 upon the operator selection of a given features in order to carryout the selected feature. Similarly, the controller 400 may instruct any one of the systems with a direct communication path to the user interface that upon existence of a desired condition, data/signals are transmitted to the local controller 310 and bypassing the controller 400. The local processor 310 thus provides local control and monitoring of load port and tool systems so that in circumstances when local control is desired usage of the controller 400 is minimized or, if desired, eliminated. In alternate embodiments, the user interface 100 may not be provided with a local processor, and substantially all processing capacity is provided by a controller similar to controller 400.

As seen in FIG. 2, the communication link 500 may include a suitable coupling or system connection interface 502 for connecting other devices or networks 600 to the communication link 500 and allowing bi-directional communication between the devices/networks and any desired components of the LPM 24 or tool 10. The coupling 502 is schematically illustrated in FIG. 2 and may be configured as desired to comply with interface parameters of the devices/networks 600 to be connected to communication link 500. For example, the coupling 502 may include a contact interface such as a USB port, Firewire port, or Ethernet port. The coupling 520 may also include a suitable wireless interface such as Bluetooth™. As may be realized, the coupling 502 may include any desired number of independent couplings that may be positioned as desired on communication link 500 (FIG. 2 shows a single coupling 502 for example purposes, and its depicted location is also merely exemplary). The devices 600 that may be communicably connected via coupling 502 may be for example a teaching pendent 602 or controller used for programming the motion of transport systems such as the substrate transport apparatus 40 of the LPM. Other devices that may be connected using coupling 502 may be PCs or peripheral devices such as printer, modem etc. Networks 604 may be a local area network (LAN), a wide area network such as the internet, or a public switched telephone network. The controller 400 may be suitably arranged to provide a "plug and play" capability to the devices/networks 602, 604 coupled via coupling 502. For example, controller 400 may include suitable software within a program module 401, 404 to select a mating to coupling 502 as well as the communication protocol for communication with the coupled device/network. Upon detection of the coupling interface the controller may initialize suitable communication software in the controller memory 401, 404 to effect communication with the coupled devices/networks.

As may be realized, controller 400 has suitable driver software for operating the display 300 and for interfacing with the user input devices (e.g. touch screen 304, keypad 306) of the user interface. As seen in FIG. 1, the controller 400 has a program module 404 with the interface software for the display 300 and input devices 304, 306 of the user interface. Program module 404, shown in FIG. 1, is a representative programming module of the controller, and may host any desired number of different programs and memory locations of the controller. The interfacing software may have any suitable architecture, such as a menu operating architecture, for example a Windows™ type architecture, though any other suitable architecture may be used.

In the case of the menu operating architecture, the interfacing software in controller 400 may display selectable keys or menu features 308A on the display 300 of the user interface 100. The software may allow selection of the displayed menu features 308A via the touch screen 304 or keypad 306. As may be realized, the selectable menu features 308A made available by the interface software correspond to executable software resident in the memory modules 401, 404 of the controller 400, or local processor 310. For example, the executable software may be an operation program for controlling operation of one or more of the individual components and systems of the tool 10 and LPM 24 or of the tool 10 as an integrated unit. Accordingly, a selectable menu feature 308A displayed on display 300 may be a command to controller 400 to initiate and execute its program for operation of tool 10 to commence processing of substrates therewith. In alternate embodiments where the operating system architecture is other than a menu type architecture, the user interface may be employed in a substantially similar manner, except operating commands to the controller may be entered by any other desired means. By way of example, the user interface keypad may be used to input one or more characters identifying operating commands to the controller, and the characters may be displayed on the user interface display screen when being entered.

As noted before, program modules 401, 404 of controller 400 may include any desired number of programs that may be accessed and executed from the user interface 100 of the LPM 24. For example, the program modules may include any desired text or data programs or files, such as installation/operation manuals, calibration trouble shooting and service guides, that may be displayed on display 300 of the user interface. The text programs, may also include tables, illustrations, graphs, photos, and video portions, structured in any desired format for display on the display 300 (for example illustrations and photos may be structured as bit maps). The text programs may be stored in the program modules 401, 404 of controller 400 during system setup, or may be downloaded subsequently from a suitable external or remote source, such as PC's on network 604, (see FIG. 2) with which the controller may communicate over communication link coupling 502. Further, the communication suite of controller 400 may allow an operator to view text and graphics files located on remote sources (e.g. devices 602, 604) and not resident on the controller. Similarly, the communication suite of the controller 400 allows information displayed on the display of remote devices 602, 604 to be displayed on the LPM display 300. For example, when the teach pendant 602 is connected to communication interface 502, such as for programming of the motion control of the substrate transport apparatus 40 (see FIG. 3), information, displayed in connection with carrying out the programming with the teach pendant, that may be displayed on a display of the teaching pendant 602, or a PC of network 604 linked to the teaching pendant 602, may also be displayed on the display 300 of the LPM user interface 100. Hence, an operator programming or "teaching" the motion of the transport apparatus of a tool similar to tool 10, may view the information associated with the "teaching" on display 300 of the very same tool, where the operator is performing the teaching. The program modules 401 may include various graphics programs, that in cooperation with machine communication programs of the controller are capable of reading and converting raw data or signals, from the systems and components of the LPM 24 and tool 10 linked to controller 400, to graphical information that may be displayed on display 300. This information may include status information and fault information of the controllable systems of tool 10. The display operating software may allow a user to select the information desired to be displayed. Hence, the user interface and display 300 of the LPM will allow an operator to effect tool setup, testing, trouble shooting and operation from the location or the LPM, without the use of further hardware.

Referring now to FIGS. 1 and 5, the LPM 24 may further include a digital camera 700 for monitoring one or more of the components in the EFEM of tool 10 as will be described further below. As seen in FIG. 1, the camera 700, which may be internal to the LPM, is mounted to extend generally inside the EFEM. The camera is seen best in FIG. 5. As noted before, in this exemplary embodiment, multiple LPMs 24A-24L are joined together to form the front face of the EFEM. In this embodiment, LPM 24B is shown as having an internal camera 700. In alternate embodiments, more than one LPM, but not all LPM's, on an EFEM may have cameras similar to LPM 24B shown in FIG. 5. The camera 700 may be mounted on the rear face of the LPM frame 29 (see FIG. 3) so that mating of the LPM 24B to the casing 16 of the EFEM positions the camera within the EFEM. The camera 700 may be integral to the LPM 24 or may be installed in the EFEM separate from the LPM 24. The camera 700 may be mounted to the LPM 24B by any suitable mounting means, such as mechanical fasteners. The position of the camera 700 relative to the LPM and system/components in the embodiment shown in FIG. 5, is merely exemplary, and in alternate embodiments the camera may be mounted in any other suitable location on the LPM frame. Further, camera 700 is schematically illustrated in FIGS. 1 and 5 as a single camera head, and camera 700 may comprise more than one camera head (not shown) distributed at different locations on the LPM frame. The camera or camera head unit 700, comprises a suitable camera chip 702 and optics 704 for directing light to the camera chip for generating a suitable image from the field of view FOV of the camera. The camera chip 702 for example may be a CMOS type or a CCD type chip, or any other suitable type of camera chip. If desired, the camera may include more than one camera chip. The camera chip(s) may have any desired resolution, and may be capable of generating color or monochrome images. The camera optics 704 may include for example, any suitable lenses, filters, mirrors, aperture (not shown) for guiding and controlling the amount of light directed to the camera chip(s) 702. The camera chip(s) 702 and optic(s) 704 are arranged so that the camera's field of view FOV and focal depth allows the camera to image a space (i.e. image coverage) that encompasses substantially the entire EFEM interior. In alternate embodiments, the camera head may be gimbaled by suitable servomotors to rotate the field of view to provide the desired image coverage for the camera. In other alternate embodiments, as noted before, multiple fixed camera heads may be employed to generate the desired image coverage. In still other embodiments, the image coverage of the camera may be limited to cover desired regions or components of the EFEM such as the substrate transport apparatus, aligner, or LPM charging opening. As may be realized, in the embodiment shown in FIGS. 1 and 5, the image coverage of camera 700 is sufficient to include generally the full range of (θ, R) motion (indicated by arrows θ, R in FIG. 5) of the substrate transport apparatus 40 at substantially any lateral location (as indicated by arrow L) along the EFEM. The image coverage by camera 700 of apparatus 40 extends between the battery position (not shown) of the apparatus 40 and extended position (not shown) at the LPM charging open 300 (see FIG. 4), or at the load locks 14L (FIG. 1). Hence, the image coverage of camera 700 allows the camera to image the transport apparatus 40 in substantially any operating θ, R position. In the exemplary embodiment shown in FIG. 5, the substrate transport apparatus has movement portion 40A movable in the directions indicated by the θ, R arrows (as described before), and thus the image coverage of camera 700 corresponds to the plane, or otherwise field of motion encompassing the operating movements of the apparatus movement portion. In alternate embodiments, the movement portion of the transport apparatus may be operated through any other type and range of movement, and the camera or cameras in the EFEM may be provided with image coverage corresponding to the field/plane of motion of the movement portion of the transport apparatus.

As seen in FIG. 5, camera 700 includes suitable processing circuitry 706 that in cooperation with the camera chip(s) 702 generates image data from the light directed upon the camera chip(s) and processes the data to a suitable format. The camera 700 may be connected to controller 400 by communication link 500, described before, that allows bi-directional communication between camera and controller. The program modules 401, 404 of the controller may include software for operating the camera 700 to capture images as desired. For example, the software in controller 400 may be a higher level program capable of sending a generate image command to the camera 700. The software in the controller, also instructs the camera 700 as to which images are to be transmitted to the controller. The processing circuitry 706 of camera 700 may include a program module (not show), for example resident in suitable memory of the processing circuitry, that directly operates and effects the image generation with the camera chip(s) 702 and processing circuitry 706 upon receiving a generate image command from the controller 400. In this embodiment, the processing circuitry 706 may also have suitable memory for buffering one or more electronic images, or data embodying the electronic image(s), as desired prior to transmission of the image(s) to the controller. The software in controller 400 is capable of receiving images from the camera, and may use the images to predict, and troubleshoot faults in the components imaged by the camera 700 such as the substrate transport apparatus 40, as will be described in greater detail below. The controller software may also be capable of displaying the images from the camera 700 on the display 300 (see also FIG. 2) of the LPM 24 described before.

Figure 13:
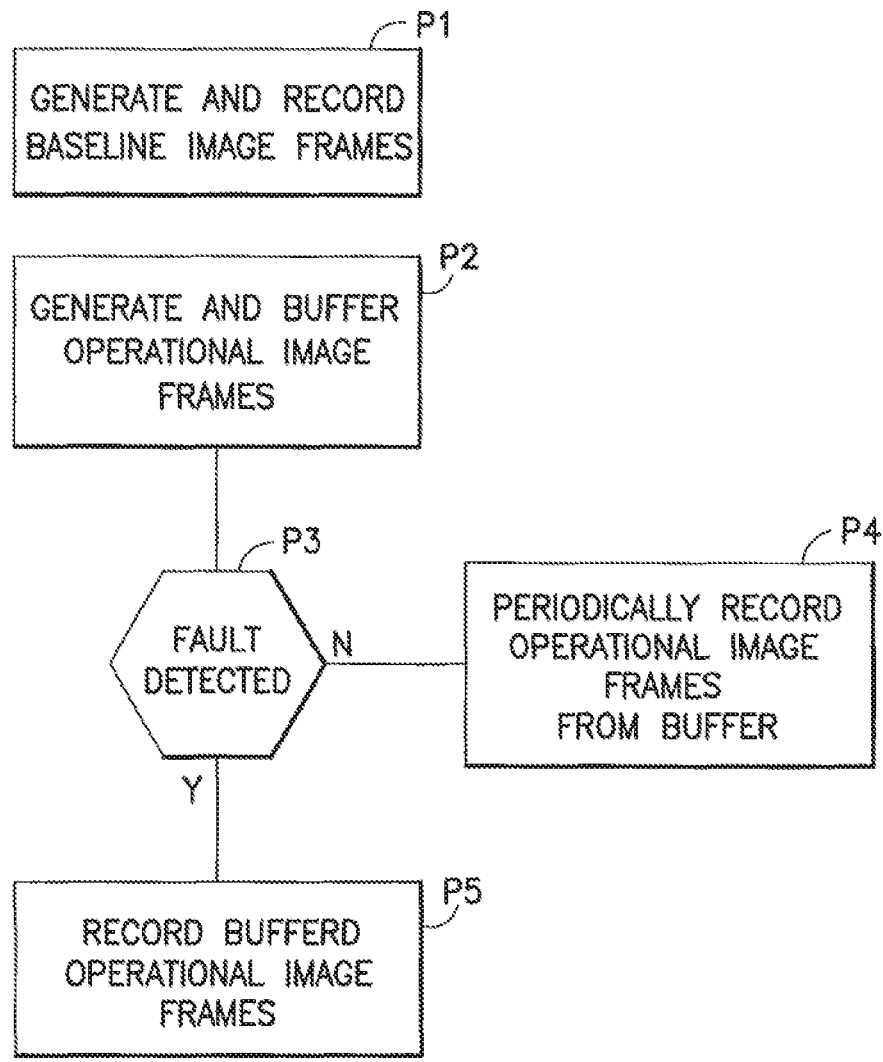
FIG. 13 is a block diagram illustrating a method in accordance with an exemplary embodiment of present invention.

Referring now to FIG. 13, there is shown a graphical representation of an exemplary method for employing the camera 700 to assist monitoring and trouble shooting faults in the substrate transport apparatus 40 on tool 10. As may be realized, the exemplary method illustrated in FIG. 13 and described below is generally applicable when camera 700 is used for monitoring and trouble shooting other components/systems within the image coverage of the camera. As seen in FIG. 13, block P1, camera 700 may be operated according to programming in controller 400 that embodies the method illustrated in FIG. 13, to generate base line image frames of movement portion 40A, of the substrate transport apparatus 40, as it undergoes its full or desired range or θ, R motion. The desired ranges of θ, R motion through which the movement portion 40A is exercised for generation of the base line image frames by camera 700 may substantially include expected θ, R motion during processing operation of the tool, as well as desired test movements related specifically to assist trouble shooting faults in the apparatus 40. The base line image frames may be generated after calibration of the movement portion 40A and also after "teaching" the controller 400 to move the movement portion 40 through the desired operational motion. In alternate embodiments, the base line image frames may be taken at any time. The timing and frequency of the image frames during motion of the movement portion commanded by software in controller 400 and/or processing circuitry 706 of camera 700, may be set as desired. For example, the camera 700 may generate image frames when the movement portion 40A is transitioning desired portions of its movement path, and camera 700 may be in a standby mode in which it does not generate image frames when the movement portion is stopped or transitioning portions of the movement data that are not of interest. In alternate embodiments, the camera 700 may be commanded to generate image frames at substantially all times the movement portion 40A is moving. The frequency of the image frames generated by camera 700 may be set as desired, such as being sufficient to form a substantially continuous video stream. The base line image frames may be recorded in the memory locations of controller 400. During operational movements of the movement portion 40A, for example in support of processing performed by the tool, the camera 700 generates operational image frames of the movement portion, block P2 in FIG. 13. The timing and frequency of the operational images frames may be similar to the timing and frequency of corresponding base line image frames (i.e. operational image frames and base line image frames are generated for substantially the same movement path of the movement portion 40A). In alternate embodiments, the timing and frequency of the operational image frames may be different (e.g. slower/less frequency) than the corresponding base line image frames. In this exemplary embodiment, the operational image frames may be buffered in the camera 700, or other suitable buffer memory and transmitted to the controller at predetermined times as described below. This reduces the processing burden on the controller 400. The buffer is sized to store a desired number of image frames. When the buffer is full, the buffered image frames may be deleted. During operation of the movement portion 40A, the controller 400 is capable of detecting faults with the movement of the movement portion. Various sensors may be included in the movement portion 40A of the transport apparatus 40 in the EFEM to sense and signal the occurrence of faults in the movement of the movement portion to the controller. As seen in FIG. 13, block P3, if no faults are detected by the controller 400 during operational movement of the movement portion 40A, some buffered operational image frames may be periodically downloaded to the controller 400 (see block P4, FIG. 13). The periodically downloaded image frames may be selected image frames from the images frames existing in the buffer memory. The image frames selected for download may correspond to a desired condition that occurs during movement of the movement portion, for example the movement portion having a certain configuration, the drive of the movement portion delivering maximum torque, or the end effector of the movement portion undergoing maximum velocity or maximum acceleration. The periodicity of the downloads of selected image frames may be set as desired, such as when other communication traffic with the connector is reduced, or once every movement cycle of movement portion 40A, or once every other movement cycle. After transmission to the controller in block P4 of FIG. 13, the downloaded image frames may be compared to the base line image frames to identify any positional deviation in the movement of the movement portion 40A. The comparison of image frames to determine positional differences of the movement portion may be performed by suitable algorithms, resident in controller 400, to identify for example, the presence of trends developing in the deviation of movement of the movement portion 40A relative to baseline, and to predict when the deviation may exceed acceptable bounds.

To facilitate use of the baseline and operational image frames, each image frame generated by the camera 700 may be provided with an identifier, such as a time tag though any other suitable identifier may be used, so that each image frame may be related to a common reference frame. This allows each image frame to be related to times of controller commands to the movement portion and actuation times of the movement portion.

As seen in FIG. 13, in the event the controller detects a fault during operational movement, block P3, the controller 400 downloads the operational image frames in the buffer memory. The controller 400 may download selected buffered image frames, such as operational image frames generated, and hence documenting movement portion position, in a given period before and after the detection of the fault event, or may download all buffered image frames (see block P5). The image frames downloaded in block P5 may be used to directly identify the location of the movement portion 40A at the time the fault was detected, and when movement of the movement portion has stopped. The location information may be used to assist in troubleshooting the fault, and in identifying the controller commands to the movement portion in order to move the movement portion from the stopped position. The downloaded operational image frames may also be compared to corresponding base line image frames to identify positional deviations from base line of the movement portion. As noted before, the method illustrated in FIG. 13 is one example of a suitable method in which the camera 700 of the LPM 24 may be employed. Camera 700 may be employed in other ways to improve the operation of the EFEM of tool 10. If desired, the cameras 700 may be capable of being operated by user commands entered via the user interface 100 to view the EFEM real time on display 300.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate loading device comprising:
a frame adapted for connecting the device to a substrate processing apparatus, the frame having a transport opening through which substrates are transported between the device and processing apparatus; and
a substrate transport container support connected to the frame for holding at least one substrate transport container, the substrate transport container support comprising
a cover covering at least a portion of the substrate transport container support on which portion the at least one substrate transport container is seated, the cover having a resiliently flexible section that is dependent from a covering surface of the cover,
at least one detector for detecting a presence of the at least one substrate transport container on the substrate transport container support, and
a protruding member connected to and protruding from the resiliently flexible section of the cover to move as a unit with the resiliently flexible section, wherein the resiliently flexible section is configured to position the protruding member relative to the at least one detector so that the protruding member cooperates with both the at least one substrate transport container and the at least one detector so that a presence of the protruding member is sensed directly by the at least one detector so that the protruding member, positioned by the resiliently flexible section, is directly sensed by the at least one detector and protruding member detection directly sensed by the at least one detector causes the at least one detector to detect the presence of the at least one substrate transport container, in contact with the protruding member, on the substrate transport container support.

2. The device according to claim 1, wherein the resiliently flexible section is resiliently deflected when the at least one substrate transport container is supported by the substrate transport container support.

3. The device according to claim 1, wherein the at least one detector is connected to the cover.

4. The device according to claim 1, wherein the at least one detector is an optical detector.

5. The device according to claim 1, wherein the at least one detector is mounted on a printed circuit board covered by the cover.

6. The device according to claim 1, wherein the at least one detector comprises a sensor residing on a printed circuit board.

7. The device according to claim 1, wherein the cover is a unitary member made of plastic.

8. The device according to claim 1, wherein the protruding member is an interrupter member for an optical detector.

9. The device according to claim 1, wherein deflection of the resiliently flexible section moves the protruding member for effecting detection of the at least one substrate transport container on the substrate transport container support.

10. The device according to claim 1, wherein the cover has a pair of slots formed therein defining the resiliently flexible section.

11. The device according to claim 1, wherein the resiliently flexible section is an elongated cantilever.

12. The device according to claim 1, wherein the resiliently flexible section and protruding member are integral to the cover and the cover is a unitary member.

13. The device according to claim 1, wherein the at least one detector is arranged so that the at least one detector cooperates with at least one information pad of the at least one substrate transport container so that the at least one detector detects both presence and at least one predetermined characteristic of the at least one substrate transport container on the substrate transport container support.

14. The substrate loading device of claim 1 wherein the resiliently flexible section forms a portion of an outer surface of the cover.

15. A substrate loading device comprising:
a frame adapted for connecting the device to a substrate processing apparatus, the frame having a transport opening through which substrates are transported between the device and processing apparatus; and
a substrate transport container support connected to the frame for holding at least one substrate transport container, the substrate transport container support comprising
a cover covering at least a portion of the substrate transport container support, on which portion the at least one substrate transport container is seated, and
at least one detector for detecting when the at least one substrate transport container is on the substrate transport container support,
wherein the cover is of unitary construction and has a resiliently flexible tab, and wherein the at least one detector comprises a protruding member mounted to and protruding from the resiliently flexible tab where the resiliently flexible tab is configured to position the protruding member relative to a respective sensor of the at least one detector so as to be directly sensed by the respective sensor, for effecting detection, with the detector, of the at least one substrate transport container, in contact with the protruding member, on the substrate transport container support.

16. The device according to claim 15, further comprising at least another detector connected to the cover for detecting when the at least one substrate transport container is in the substrate transport container support, wherein the cover has another resiliently flexible tab and the at least another detector has another protruding member mounted to the other resiliently flexible tab.

17. The device according to claim 15, wherein the resiliently flexible tab is resiliently deflected when the substrate transport container is supported by the substrate transport container support.

18. The device according to claim 15, wherein the at least one detector is an optical detector.

19. The device according to claim 15, wherein the at least one detector is arranged so that the at least one detector cooperates with at least one information pad of the at least one substrate transport container so that the at least one detector detects both presence and at least one predetermined characteristic of the at least one substrate transport container on the substrate transport container support.

20. A substrate loading device comprising:
a frame adapted for connecting the device to a substrate processing apparatus, the frame having a transport opening through which substrates are transported between the device and processing apparatus; and
a substrate transport container support connected to the frame for holding at least one substrate transport container, the substrate transport container support comprising
a cover covering at least a portion of the substrate transport container support on which portion the at least one substrate transport container is seated, the cover having a resiliently flexible section that is dependent from a covering surface of the cover, and
at least one detector configured for detecting a presence of the at least one substrate transport container on the substrate transport container support,
wherein the resiliently flexible section has member with a protrusion that is positioned on and by the resiliently flexible section so that the protrusion of the member interfaces with the at least one detector so that a sensor of the at least one detector contactlessly senses the protrusion positioned on and by the resiliently flexible section causing the at least one detector to detect the presence of the substrate transport container, in contact with the protrusion, on the substrate transport container support.

21. The device according to claim 20, wherein the resiliently flexible section is integral to the cover and the cover is a unitary member.

22. The device according to claim 20, wherein the member is connected to the resiliently flexible section of the cover to move as a unit with the resiliently flexible section.

23. The device according to claim 22, wherein the resiliently flexible section and member are integral to the cover and the cover is a unitary member.

24. The device according to claim 20, wherein the at least one detector is arranged so that the at least one detector cooperates with at least one information pad of the substrate transport container so that the at least one detector detects both presence and at least one predetermined characteristic of the substrate transport container on the substrate transport container support.

* * * * *